US012610700B2

(12) United States Patent
Yi et al.

(10) Patent No.: US 12,610,700 B2
(45) Date of Patent: *Apr. 21, 2026

(54) DISPLAY DEVICE INCLUDING LOWER PATTERN

(71) Applicant: Samsung Display Co., LTD., Yongin-si (KR)

(72) Inventors: Changho Yi, Seoul (KR); Jung-Woo Ha, Asan-si (KR); Jong-Ryuk Park, Cheonan-si (KR); Ji-Eun Lee, Seoul (KR); Sungho Kim, Suwon-si (KR); Joonhyoung Park, Seongnam-si (KR); Seokje Seong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/602,674

(22) Filed: Mar. 12, 2024

(65) Prior Publication Data

US 2024/0224632 A1     Jul. 4, 2024

Related U.S. Application Data

(63) Continuation of application No. 17/375,461, filed on Jul. 14, 2021, now Pat. No. 11,963,404.

(30) Foreign Application Priority Data

Nov. 30, 2020     (KR) ........................ 10-2020-0164417

(51) Int. Cl.
*H10K 59/126*     (2023.01)
*G02F 1/133*     (2006.01)
(Continued)

(52) U.S. Cl.
CPC ........... *H10K 59/126* (2023.02); *G02F 1/133* (2013.01); *G02F 1/13306* (2013.01);
(Continued)

(58) Field of Classification Search
CPC .......................... H10K 59/131; H10K 59/124
See application file for complete search history.

(56) References Cited

U.S. PATENT DOCUMENTS 7,067,845 B2     6/2006  Murakami et al.
2003/0222589 A1   12/2003  Osame et al.
(Continued)

FOREIGN PATENT DOCUMENTS

JP        H11142887 A     5/1999
WO      2020111420 A1     6/2020

OTHER PUBLICATIONS

Anonymous:"Line (curve)—Encylopedia of Mathematics", Aug. 7, 2011 (Aug. 7, 2011), XP093171454, Retrieved from the Internet: URL:https://encyclopediaofmath.org/index.php?title=Line_(curve) &oldid=15722.

(Continued)

*Primary Examiner* — Lauren Nguyen
(74) *Attorney, Agent, or Firm* — CANTOR COLBURN LLP

(57)     ABSTRACT

A display device includes a substrate including an organic film layer, a first lower pattern which is disposed on the substrate, includes overlap patterns, first bridges, and second bridges, and has a mesh shape, a second lower pattern which is disposed in a same layer as the first lower pattern, is connected to the first lower pattern, and surrounds the first lower pattern, a first active pattern disposed on the first lower pattern, and a plurality of gate electrodes disposed on the first active pattern and overlapping the overlap patterns.

14 Claims, 30 Drawing Sheets

(51) Int. Cl.

| | |
|---|---|
| *G02F 1/1362* | (2006.01) |
| *H10K 59/131* | (2023.01) |
| *H10K 77/10* | (2023.01) |

(52) U.S. Cl.

CPC .... *G02F 1/136286* (2013.01); *G02F 1/13629* (2021.01); *H10K 59/131* (2023.02); *H10K 77/10* (2023.02)

(56) References Cited

U.S. PATENT DOCUMENTS

| | | | |
|---|---|---|---|
| 2017/0017129 A1 | 1/2017 | Zhao et al. | |
| 2017/0033127 A1 | 2/2017 | Zhao et al. | |
| 2017/0277313 A1 | 9/2017 | Lee et al. | |
| 2019/0005885 A1 | 1/2019 | Kim et al. | |
| 2019/0081090 A1* | 3/2019 | Lee | H01L 27/0288 |
| 2019/0341431 A1* | 11/2019 | Lee | G09G 3/3258 |
| 2020/0066765 A1 | 2/2020 | Cho et al. | |
| 2020/0166814 A1* | 5/2020 | Guan | G02F 1/13452 |
| 2020/0350341 A1 | 11/2020 | Hanada et al. | |
| 2022/0115480 A1 | 4/2022 | Park et al. | |

OTHER PUBLICATIONS

European Office Action for Application No. 21195607.3-1001 dated Jun. 25, 2024, enumerating the above listed reference.

Extended European Search Report for Application No. 21195607.3-1230 dated Feb. 23, 2022.

Korean Office Action for Korean Application No. 10-2020-0164417; Report Mail Date Feb. 26, 2026 (24 Pages with Translation).

* cited by examiner

FIG. 2

F I G. 6
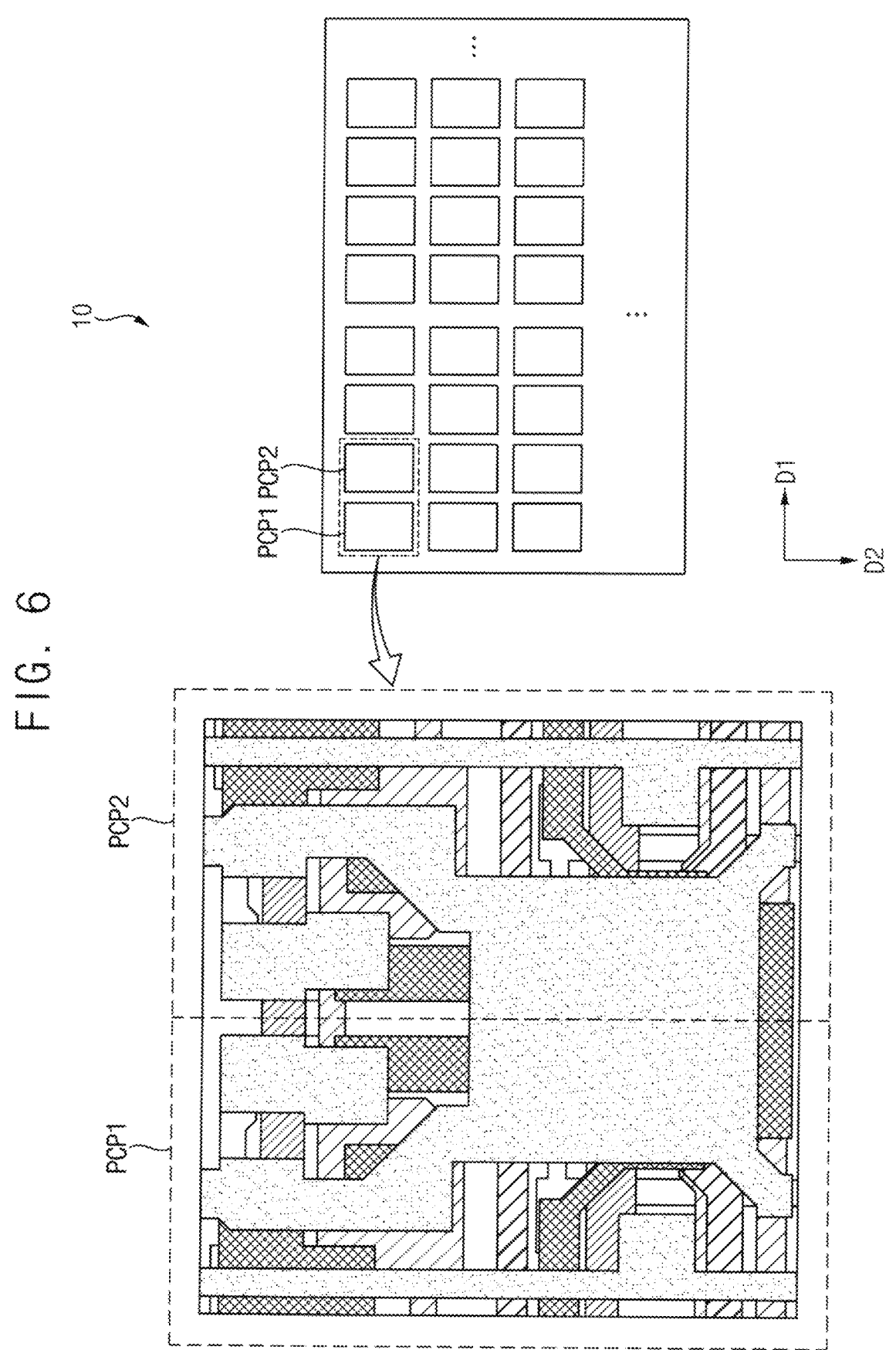

DISPLAY DEVICE INCLUDING LOWER PATTERN

This application is a continuation of U.S. patent application Ser. No. 17/375,461, filed on Jul. 14, 2021, which claims priority to Korean Patent Application No. 10-2020-0164417, filed on Nov. 30, 2020, and all the benefits accruing therefrom under 35 U.S.C. § 119, the content of which in its entirety is herein incorporated by reference.

BACKGROUND

1. Field

Embodiments of the invention relate generally to a display device. More particularly, embodiments of the invention relate to a display device including a lower pattern.

2. Description of the Related Art

A display device includes a display panel, and transistors including an active pattern are disposed in the display panel. An electric field may be generated inside the display panel due to signals and voltages provided to the display panel. Organic materials included in a substrate of the display panel may be polarized by the electric field.

SUMMARY

Polarized organic materials may have an electrical effect on an active pattern included in a display panel. Accordingly, electrical characteristics of transistors of a display device may be changed. For this reason, display quality of the display device may be deteriorated.

Embodiments provide a display device which enhances the display quality of display device.

A display device in an embodiment may include a substrate including an organic film layer, a first barrier layer disposed on the substrate, a first lower pattern which is disposed on the first barrier layer, includes overlap patterns, a plurality of first bridges, and a plurality of second bridges, and has a mesh shape such that the plurality of first bridges extends in a first direction and connects the overlap patterns to each other, and the plurality of second bridges extends in a second direction crossing the first direction and connects the overlap patterns to each other, a second lower pattern which is disposed in a same layer as the first lower pattern, is connected to the first lower pattern, and surrounds the first lower pattern, a second barrier layer disposed on the first lower pattern, a first active pattern disposed on the second barrier layer, and a plurality of gate electrodes disposed on the first active pattern and overlapping the overlap pattern.

In an embodiment, the second lower pattern may be unitary with the first lower pattern.

In an embodiment, the second lower pattern may have a closed curve shape.

In an embodiment, the second lower pattern may have a rectangular shape with rounded corners.

In an embodiment, the second lower pattern may include a vertical pattern extending in the second direction.

In an embodiment, the vertical pattern may be connected to first bridges, which are disposed at an edge of the mesh shape, among the plurality of first bridges.

In an embodiment, the vertical pattern may have a first width constant in the first direction.

In an embodiment, the first width may be greater than a second width which is a width of each of the first bridges in the second direction.

In an embodiment, the first width may be about 1.8 times or more greater than the second width.

In an embodiment, the first width may be smaller than about 4 micrometers ($\mu$m).

In an embodiment, the vertical pattern may include first partial vertical patterns having a same shape as a shape of the overlap patterns and second partial vertical patterns having a same shape as a shape of the plurality of second bridges.

In an embodiment, the second lower pattern may include a horizontal pattern extending in the first direction.

In an embodiment, the horizontal pattern may be connected to second bridges, which are disposed at a bottom of the mesh shape, among the plurality of second bridges.

In an embodiment, the horizontal pattern may have a width constant in the second direction.

In an embodiment, the horizontal pattern may be provided with a power voltage.

In an embodiment, the display device may further include a power voltage bus disposed on the horizontal pattern and electrically connected to the horizontal pattern through a contact hole.

In an embodiment, the horizontal pattern may be connected to second bridges, which are disposed at a top of the mesh shape, among the plurality of second bridges.

In an embodiment, the horizontal pattern may have a width constant in the second direction.

In an embodiment, the horizontal pattern may be provided with a power voltage.

In an embodiment, the display device may further include a power voltage pattern disposed on the horizontal pattern and electrically connected to the horizontal pattern through a contact hole.

In an embodiment, the second lower pattern may include a vertical pattern extending in the second direction, a horizontal pattern extending in the first direction, and a corner pattern connecting the vertical pattern and the horizontal pattern.

In an embodiment, the display device may further include a first connection line connecting the corner pattern and second bridges adjacent to the corner pattern among the plurality of second bridges and a second connection line connecting the corner pattern and the first connection line.

In an embodiment, the display device may further include a third connection line connecting the first connection line, the second connection line, and the corner pattern.

In an embodiment, the display device may be divided into a hole area in which a hole is defined and a display area surrounding at least a portion of the hole area, and the display device may further include a third lower pattern which is disposed in a same layer as the first lower pattern, connects the first lower pattern, overlaps the display area, and surrounds the hole area.

In an embodiment, the display device may further include a fourth connection line extending in the first direction, and connecting the third lower pattern and second bridges adjacent to the third lower pattern among the plurality of second bridges and a fifth connection line extending in the second direction, and connecting the fourth connection line and first bridges adjacent to the third lower pattern among the plurality of first bridges.

In an embodiment, the display device may further include a sixth connection line extending in the second direction, and connecting the third lower pattern and first bridges adjacent to the third lower pattern among the plurality of first bridges.

In an embodiment, the display device may further include a first gate line which is disposed in a same layer as the gate electrodes, is adjacent to a first side of the gate electrodes, and extends in the first direction, a second gate line which is disposed on the first gate line, is adjacent to a second side of the gate electrode opposite to the first side, and extends in the first direction, a second active pattern disposed on the second gate line, and a third gate line which is disposed on the second active pattern, overlaps the second gate line, is electrically connected to the second gate line, and extends in the first direction.

In an embodiment, the display device may further include a power voltage line disposed on the third gate line, extending in the second direction, overlapping the second bridges, and transmitting a power voltage.

In an embodiment, the first active pattern may include a silicon semiconductor, and the second active pattern may include an oxide semiconductor.

In an embodiment, the first lower pattern and the second lower pattern may include a same metal as a metal of the gate electrodes.

A display device according to another embodiment may be divided into a hole area in which a hole is defined and a display area surrounding at least a portion of the hole area. The display device may include a substrate including an organic film layer, a first barrier layer disposed on the substrate, a first lower pattern which is disposed on the first barrier layer, includes overlap patterns, a plurality of first bridges, and a plurality of second bridges, and has a mesh shape such that the plurality of first bridges extends in a first direction and connects the overlap patterns to each other, and the plurality of second bridges extends in a second direction crossing the first direction and connects the overlap patterns to each other, a second lower pattern which is disposed in a same layer as the first lower pattern, is connected to the first lower pattern, overlaps the display area, and surrounds the hole area, a second barrier layer disposed on the first lower pattern, a first active pattern disposed on the second barrier layer, and a plurality of gate electrodes disposed on the first active pattern and overlapping the overlap patterns.

In an embodiment, the second lower pattern may be unitary with the first lower pattern.

In an embodiment, the hole area and the second lower pattern may have a circular shape.

In an embodiment, the display device may further include a first connection line extending in the first direction, and connecting the second lower pattern and second bridges adjacent to the second lower pattern among the plurality of second bridges and a second connection line extending in the second direction, and connecting the first connection line and first bridges adjacent to the second lower pattern among the plurality of first bridges.

In an embodiment, the display device may further include a third connection line extending in the second direction, and connecting the second lower pattern and first bridges adjacent to the second lower pattern among the plurality of first bridges.

Therefore, a display device in embodiments of the invention may include a lower pattern layer disposed between an organic film layer and the active pattern. A first lower pattern and a second lower pattern may be provided in the lower pattern layer.

The first lower pattern may be entirely disposed in a display area and may have a mesh shape. The first lower pattern may include overlap patterns overlapping gate electrodes. The overlap patterns may shield the active pattern from polarization of organic materials included in the organic film layer. Accordingly, electrical characteristics of a transistor may not be changed.

In addition, as the first lower pattern includes first bridges and second bridges which connect the overlap patterns to each other, a surface area of the first lower pattern may be increased, and the overlap patterns may be connected to each other. Accordingly, a power voltage may be provided to the first lower pattern, and a resistance deviation of the first lower pattern may be reduced. Therefore, luminance deviation that may occur between the pixels may be prevented.

The second lower pattern may surround the first lower pattern. In detail, the second lower pattern may be unitary with the first lower pattern, and may prevent the first bridges and the second bridges from protruding. Since the second lower pattern prevents the first and second bridges from protruding, a static electricity may not flow into a display panel and an electric breakdown may be prevented.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 2 is a block diagram illustrating the display device of FIG. 1.

FIG. 6 to FIG. 17 are layout diagrams illustrating the display device of FIG. 1.

FIG. 22 is an enlarged view illustrating an embodiment of area B of FIG. 19.

FIG. 27 is an enlarged view illustrating still another embodiment of area D of FIG. 19.

DETAILED DESCRIPTION

Figure 1:
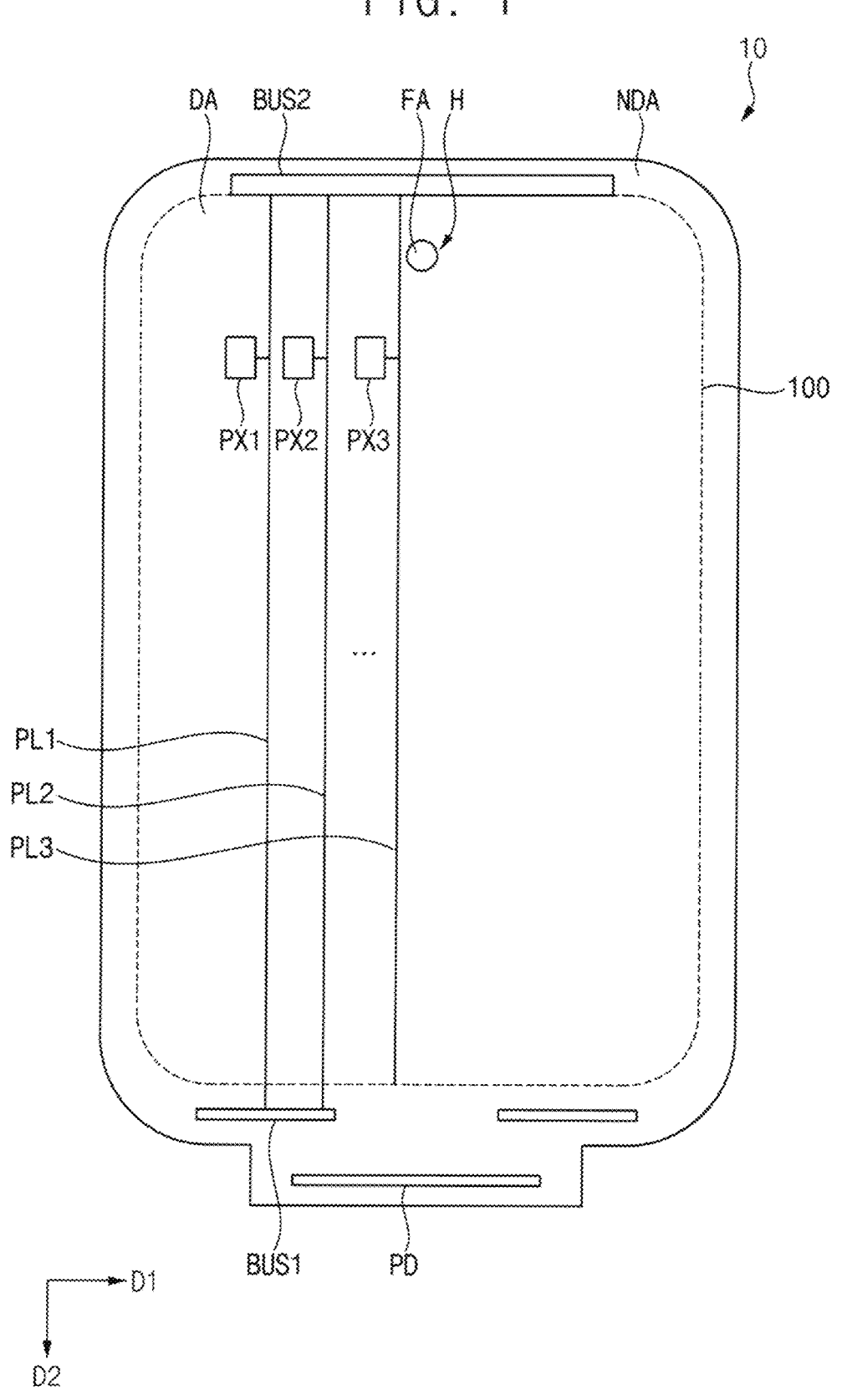
FIG. 1 is a plan view illustrating an embodiment of a display device.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
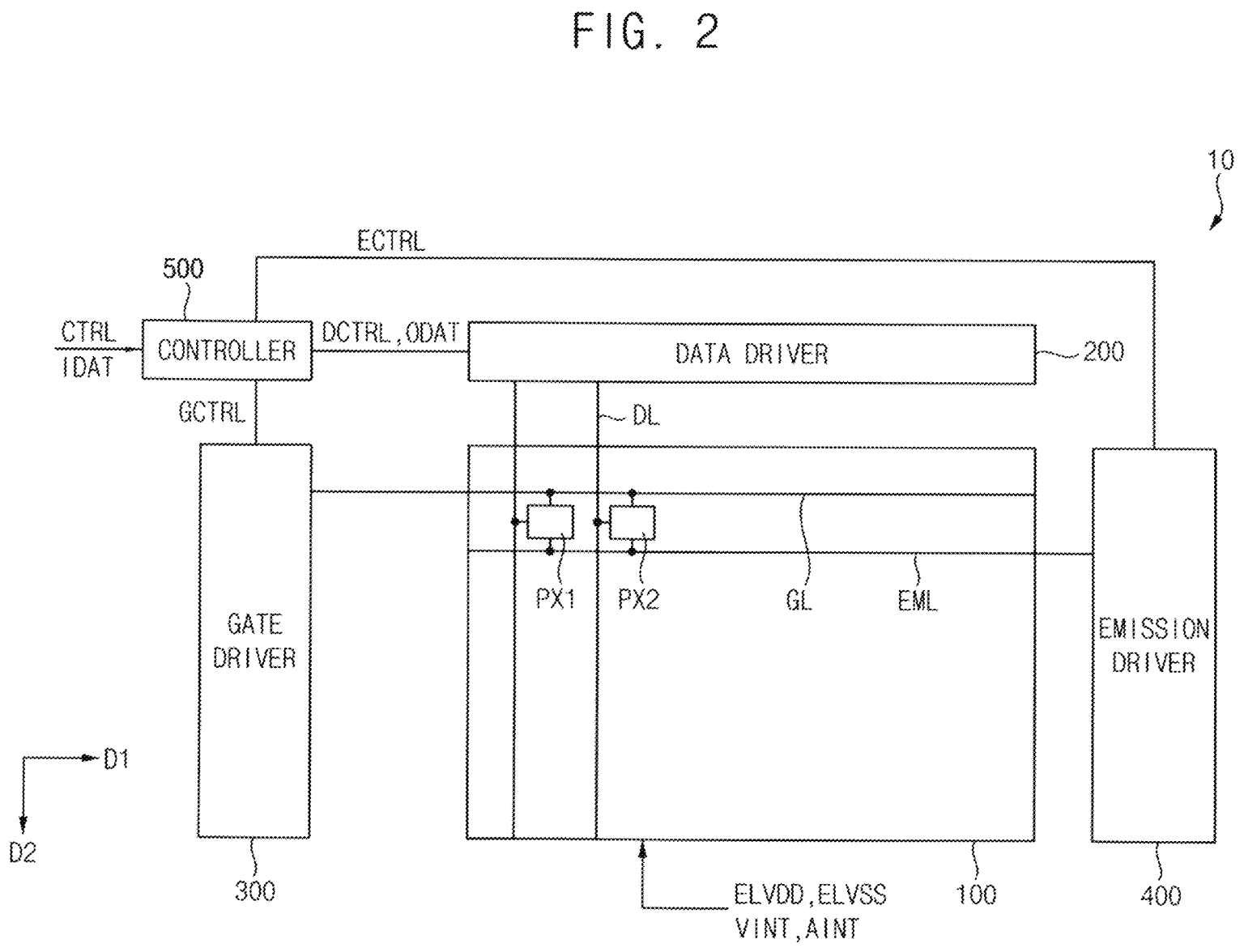
Figure 3:
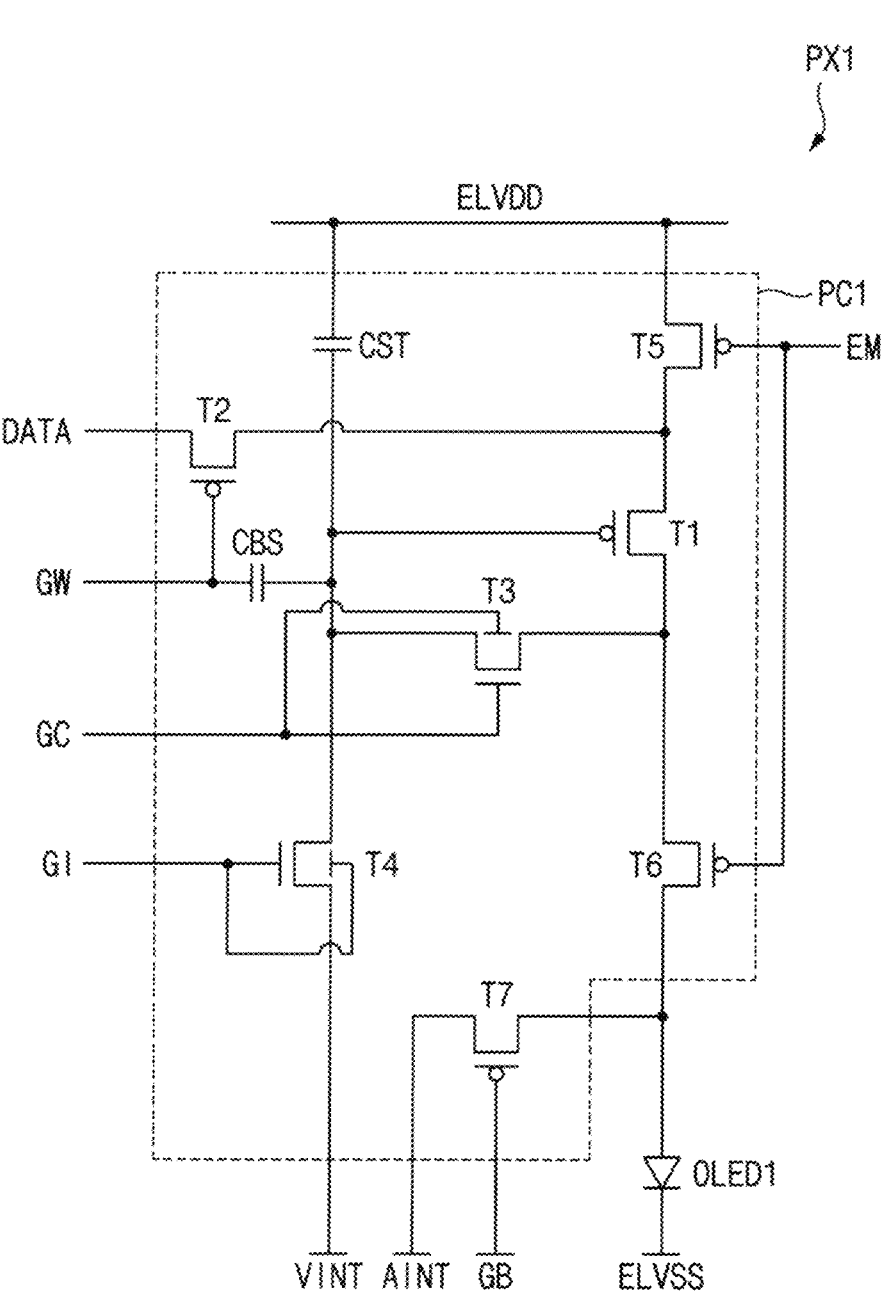
FIG. 3 is an equivalent circuit diagram illustrating a first pixel included in the display device of FIG. 2.

FIG. 1 is a plan view illustrating an embodiment of a display device. FIG. 2 is a block diagram illustrating the display device of FIG. 1. FIG. 3 is an equivalent circuit diagram illustrating a first pixel included in the display device of FIG. 2.

Referring to FIGS. 1, 2, and 3, a display device 10 in an embodiment may be divided into a hole area FA, a display area DA, and a non-display area NDA. In an embodiment, a hole H may be defined in the hole area FA. The display area DA may have a quadrangular (e.g., rectangular) shape having a short side extending in a first direction D1 and a long side extending in a second direction D2 crossing the first direction D1. The display area DA may surround at least a portion of the hole area FA, for example. The non-display area NDA may surround the display area DA.

A functional module may be disposed in the hole H. In an embodiment, the functional module may include a camera module for capturing (or recognizing) an image of an object, a face recognition sensor module for detecting the user's face, a pupil recognition sensor module for detecting the user's pupils, an acceleration sensor module and a geomagnetic sensor module for determining a movement of the display device 10, a proximity sensor module and an infrared sensor module for detecting whether an object is close to a front surface of the display device 10, an illuminance sensor module for measuring a degree of external brightness, etc., for example.

The display panel 100 may be disposed in the display area DA and the hole area FA. A data driver 200, a gate driver 300, an emission driver 400, and a timing controller 500 may be disposed in the non-display area NDA.

A first pixel PX1, a second pixel PX2, and a third pixel PX3 may be disposed on the display panel 100. Each of the first to third pixels PX1, PX2, and PX3 may be electrically connected to a data line DL, a gate line GL, and an emission management line EML.

The data line DL may be connected to the data driver 200 and may extend in the second direction D2. The data line DL may transmit a data voltage DATA.

The gate line GL may be connected to the gate driver 300 and may extend in the first direction D1. The gate line GL may transmit gate signals GW, GC, GI, and GB.

The emission management line EML may be connected to the emission driver 400 and may extend in the first direction D1. The emission management line EML may transmit an emission management signal EM. In an embodiment, an activation period of the emission management signal EM may be an emission period of the display device 10, and an inactivation period of the emission management signal EM may be a non-emission period of the display device 10, for example.

The gate driver 300 may receive a gate control signal GCTRL from the timing controller 500 and may generate the gate signals GS, GC, GI, and GB. In an embodiment, the gate signals GS, GC, GI, and GB may include a first gate signal GW, a second gate signal GC, a third gate signal GI, and a fourth gate signal GB, for example.

The data driver 200 may receive output image data ODAT and a data control signal DCTRL from the timing controller 500 and may generate the data voltage DATA. The emission driver 400 may receive an emission driving control signal ECTRL from the timing controller 500 and may generate the emission management signal EM. The timing controller 500 may receive a control signal CTRL and input image data IDAT from an external device, and may control the data driver 200, the gate driver 300, and the emission driver 400.

In an embodiment, the data driver 200 and the timing controller 500 may be disposed on a flexible printed circuit board, and the gate driver 300 may be adjacent to a side (e.g., a left side) of the display area DA, for example. The emission driver 400 may be disposed (e.g., mounted) in the non-display area NDA, and the emission driver 400 may be disposed (e.g., mounted) in the non-display area NDA adjacent to a right side of the display area DA. However, positions where the data driver 200, the gate driver 300, the emission driver 400, and the timing controller 500 are disposed are not limited thereto.

The first pixel PX1 may include a first pixel circuit PC1 and a first organic light emitting diode OLED1. The first pixel circuit PC1 may provide a driving current to the first organic light emitting diode OLED1, and the first organic light emitting diode OLED1 may generate light based on the driving current. Each of the second and third pixels PX2 and PX3 may have substantially the same circuit structure as the circuit structure of the first pixel PX1.

The first pixel circuit PC1 may include a first transistor T1, a second transistor T2, a third transistor T3, a fourth transistor T4, a fifth transistor T5, a sixth transistor T6, a seventh transistor T7, a storage capacitor CST, and a boosting capacitor CBS.

The first organic light emitting diode OLED1 may include a first terminal (e.g., an anode terminal) and a second terminal (e.g., a cathode terminal), the first terminal may be connected to the sixth transistor T6 and the seventh transistor T7, and the second terminal may receive a common voltage ELVSS. The first organic light emitting diode OLED1 may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive a power voltage ELVDD. The storage capacitor CST may maintain a voltage level of a gate terminal of the first transistor T1 during an inactive period of the first gate signal GW.

The boosting capacitor CBS may include a first terminal and a second terminal. The first terminal of the boosting capacitor CBS may be connected to the third transistor T3, and the second terminal of the boosting capacitor CBS may receive the first gate signal GW. As the boosting capacitor CBS increases the voltage of the gate terminal of the first transistor T1 at a time when the provision of the first gate signal GW is stopped, the boosting capacitor CBS may be compensated for a voltage drop of the gate terminal.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 and may receive the data voltage DATA. The second terminal of the first transistor T1 may be connected to the sixth transistor T6. The first transistor T1 may generate the driving current based on a voltage difference between the gate terminal and the first terminal. In an embodiment, the first transistor T1 may be also referred to as a driving transistor, for example.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. In an embodiment, when the second transistor T2 is a p-channel (+) metal-oxide-semiconductor ("PMOS") transistor, the second transistor T2 may be turned off when the first gate signal GW has a positive voltage level, and may be turned on when the first gate signal GW has a negative voltage level, for example. The first terminal of the second transistor T2 may receive the data voltage DATA through the data line DL. The second terminal of the second transistor T2 may provide the data voltage DATA to the first terminal of the first transistor T1 while the second transistor T2 is turned on. In an embodiment, the second transistor T2 may be also referred to as a switching transistor, for example.

The third transistor T3 may include a gate terminal, a bottom gate terminal, a first terminal (e.g., a source terminal), and a second terminal (e.g., a drain terminal). The gate terminal and the bottom gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. In an embodiment, when the third transistor T3 is an n-channel (−) metal-oxide-semiconductor ("NMOS") transistor, the third transistor T3 may be turned on when the second gate signal GC has a positive voltage level, and may be turned off when the second gate signal GC has a negative voltage level, for example.

During a period in which the third transistor T3 is turned on in response to the second gate signal GC, the third transistor T3 may diode-connect the first transistor T1. The third transistor T3 may compensate for a threshold voltage of the first transistor T1. In an embodiment, the third transistor T3 may be also referred to as a compensation transistor, for example.

The fourth transistor T4 may include a gate terminal, a bottom gate terminal, a first terminal (e.g., a source terminal), and a second terminal (e.g., a drain terminal). The gate terminal and the bottom gate terminal of the fourth transistor T4 may receive the third gate signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or off in response to the third gate signal GI. In an embodiment, when the fourth transistor T4 is an NMOS transistor, the fourth transistor T4 may be turned on when the third gate signal GI has a positive voltage level, and may be turned off when the third gate signal GI has a negative voltage level, for example.

During a period in which the fourth transistor T4 is turned on to the third gate signal GI, the gate initialization voltage VINT may be provided to a gate terminal of the first transistor T1. Accordingly, the fourth transistor T4 may initialize the gate terminal of the first transistor T1 to the gate initialization voltage VINT. In an embodiment, the fourth transistor T4 may be also referred to as a gate initialization transistor, for example.

The fifth transistor T5 may include a gate terminal, a first terminal (e.g., a source terminal), and a second terminal (e.g., a drain terminal). The gate terminal of the fifth transistor T5 may receive the emission management signal EM. The first terminal of the fifth transistor T5 may receive the power voltage ELVDD. The second terminal of the fifth transistor T5 may be connected to the first transistor T1. When the fifth transistor T5 is turned on in response to the emission management signal EM, the fifth transistor T5 may provide the power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission management signal EM. The first terminal of the sixth transistor T6 may be connected to the first transistor T1. The second terminal of the sixth transistor T6 may be connected to the first organic light emitting diode OLED1. When the sixth transistor T6 is turned on in response to the emission management signal EM, the sixth transistor T6 may provide the driving current to the first organic light emitting diode OLED1.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may be connected to the first organic light emitting diode OLED1. The second terminal of the seventh transistor T7 may receive an anode initialization voltage AINT.

When the seventh transistor T7 is turned on in response to the fourth gate signal GB, the seventh transistor T7 may provide the anode initialization voltage AINT to the first organic light emitting diode OLED1. Accordingly, the seventh transistor T7 may initialize the first terminal of the first organic light emitting diode OLED1 to the anode initialization voltage AINT. In an embodiment, the seventh transistor T7 may be also referred to as an anode initialization transistor, for example.

In an embodiment, the first, second, fifth, sixth, and seventh transistors T1, T2, T5, T6, T7 may be PMOS transistors, and the third and fourth transistors T3 and T4 may be NMOS transistors. Accordingly, the first active patterns of the PMOS transistors may include a silicon semiconductor doped with positive ions, and the second active patterns of the NMOS transistors may include an oxide semiconductor. In addition, the first gate signal GW, the emission management signal EM, and fourth gate signal GB for turning on each of the second, fifth, sixth, and seventh transistors T2, T5, T6, and T7 may have a negative level, and the second gate signal GC and the third gate signal GI for turning on the third and fourth transistors T3 and T4 may have a positive voltage level.

The circuit structure of the first pixel circuit PC1 illustrated in FIG. 3 is exemplary and may be variously changed.

As shown in FIG. 1, the first to third pixels PX1, PX2, and PX3 may be disposed along the first direction D1. The first pixel PX1 may be adjacent to the second pixel PX2. The third pixel PX3 may be spaced apart from the second pixel PX2.

A power voltage bus BUS1 may be disposed in a bottom side to the left side of the non-display area NDA. A power voltage pattern BUS2 may be disposed in a top side of the non-display area NDA.

The first pixel PX1 may be connected to a first power voltage line PL1, the second pixel PX2 may be connected to a second power voltage line PL2, and the third pixel PX3 may be connected to the third power voltage line PL3. The first power voltage line PL1 and the second power voltage line PL2 may be connected to the power voltage bus BUS1. In addition, the first power voltage line PL1, the second power voltage line PL2, and the third power voltage line PL3 may be connected to the power voltage pattern BUS2.

The power voltage bus BUS1 may receive the power voltage ELVDD from a pad part PD. Accordingly, the first and second pixels PX1 and PX2 may receive the power voltage ELVDD through the first and second power voltage lines PL1 and PL2, respectively. In addition, the power voltage pattern BUS2 may receive the power voltage ELVDD through the first and second power voltage lines PL1 and PL2. Accordingly, the third pixel PX3 may receive the power voltage ELVDD through the third power voltage line PL3. As the display device 10 includes the power voltage pattern BUS2, a voltage drop ("IR-Drop") of the power voltage ELVDD may be prevented.

In an embodiment, the first power voltage line PL1, the second power voltage line PL2, and the power voltage pattern BUS2 may be unitary. In an embodiment, the first power voltage line PL1 and the second power voltage line PL2 may correspond to the power voltage line 1720 of FIG. 17, for example.

Figure 4:
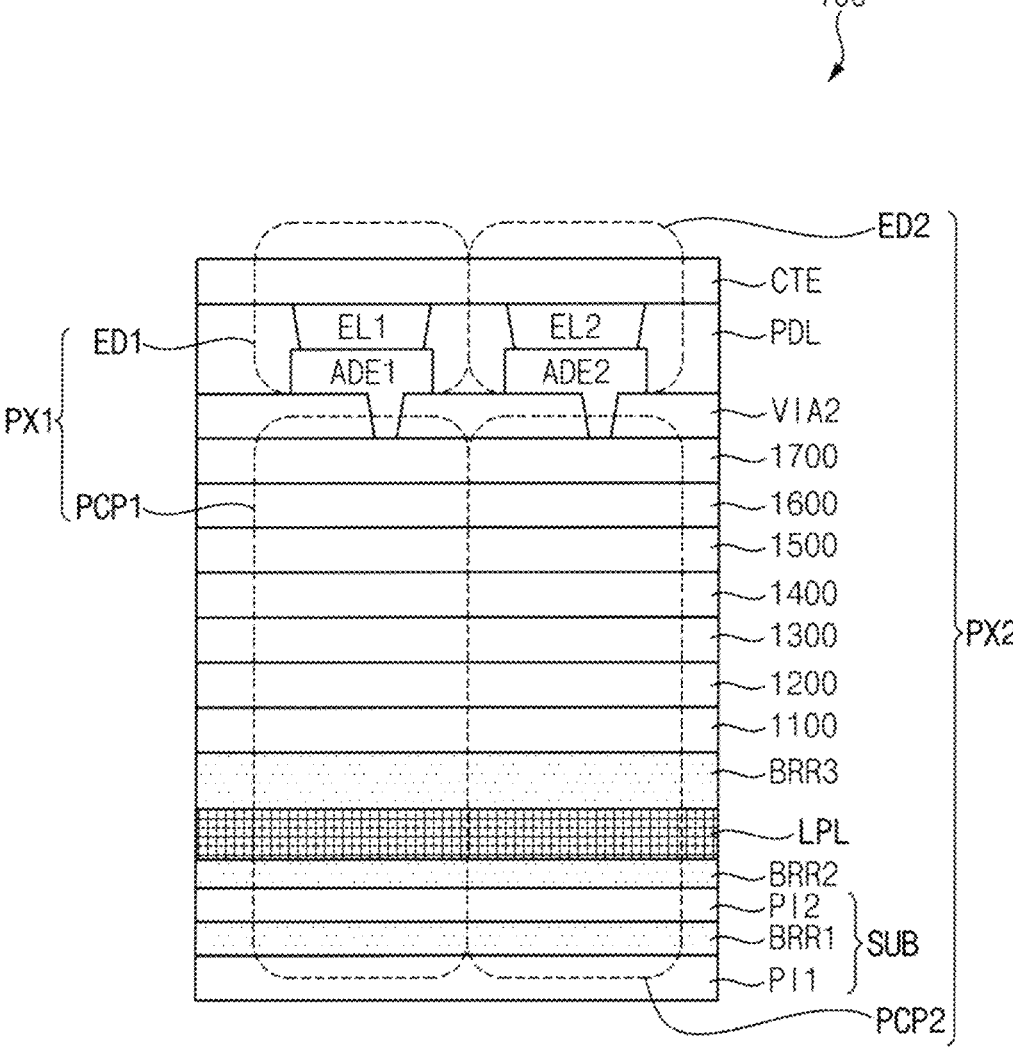
FIG. 4 is a cross-sectional view illustrating a display panel included in the display device of FIG. 1.
Figure 5:
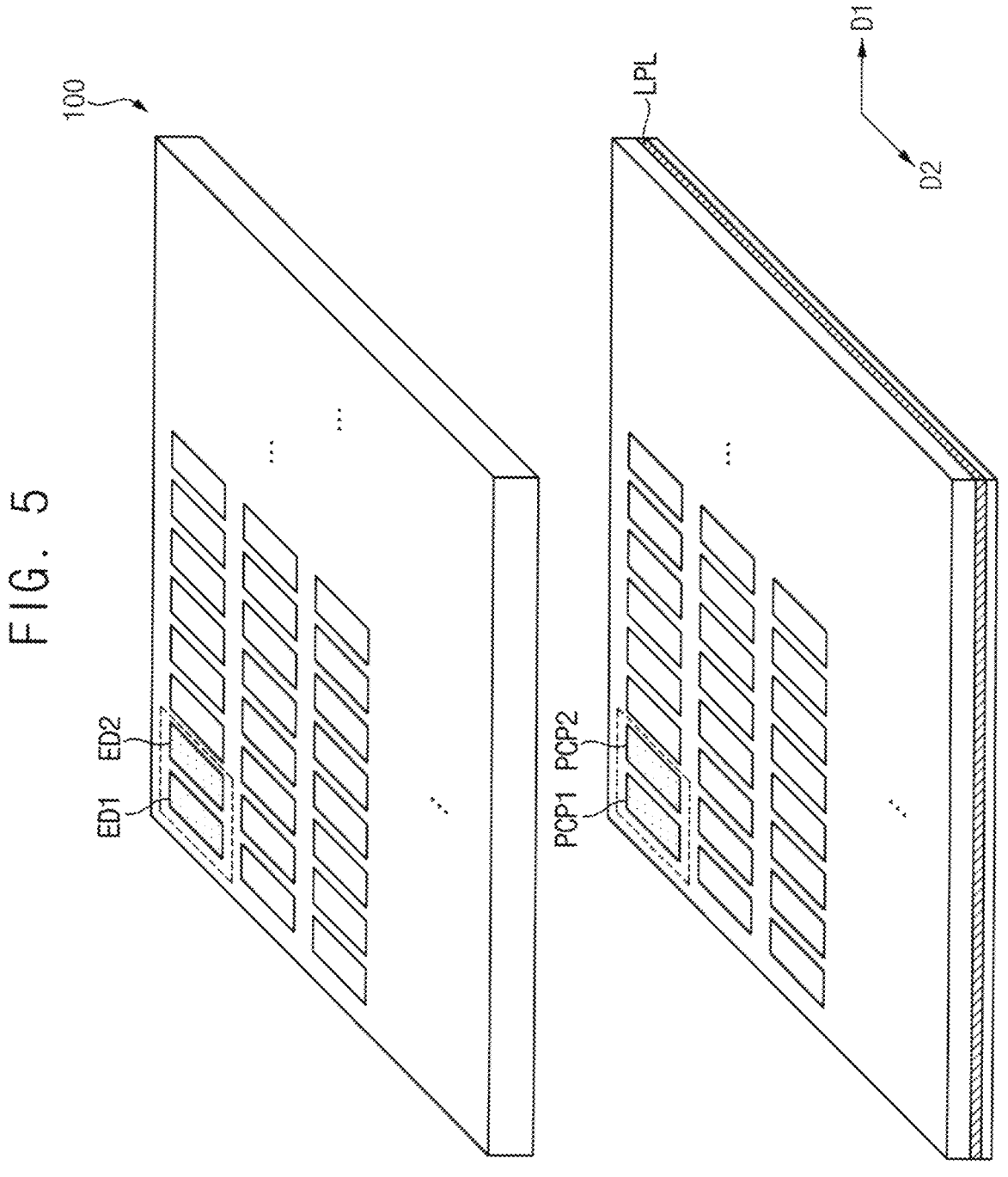
FIG. 5 is a perspective view illustrating a display panel included in the display device of FIG. 1.

FIG. 4 is a cross-sectional view illustrating a display panel included in the display device of FIG. 1. FIG. 5 is a perspective view illustrating a display panel included in the display device of FIG. 1.

Referring to FIGS. 1, 4, and 5, the display panel 100 may include first and second pixel circuit parts PCP1 and PCP2 and first and second emitting diodes ED1 and ED2.

In an embodiment, the first pixel circuit part PCP1 and the first emitting diode ED1 may constitute the first pixel PX1. In an embodiment, the first pixel circuit part PCP1 may correspond to the first pixel circuit PC1, and the first emitting diode ED1 may correspond to the first organic light emitting diode OLED1, for example. In other words, the transistors may be provided in the first pixel circuit part PCP1, and the first pixel circuit part PCP1 may provide the driving current to the first emitting diode ED1. In addition, the second pixel circuit part PCP2 and the second emitting diode ED2 may constitute the second pixel PX2.

The first emitting diode ED1 may include a first pixel electrode ADE1, a first emission layer EL1, and a common electrode CTE. In an embodiment, the first emission layer EL1 may generate light having a first color, for example. The second emitting diode ED2 may include a second pixel electrode ADE2, a second emission layer EL2, and the common electrode CTE. In an embodiment, the second emission layer EL2 may generate light having a second color, for example. In an embodiment, the first and second pixel electrodes ADE1 and ADE2 and the first and second emitting diodes ED1 and ED2 may be disposed in openings defined in a pixel defining layer PDL.

The first pixel circuit part PCP1 may include a first organic film layer PI1, a first barrier layer BRR1, a second organic film layer PI2, a second barrier layer BRR2, a lower pattern layer LPL, a third barrier layer BRR3, a first active pattern 1100, a first conductive pattern 1200, a second conductive pattern 1300, a second active pattern 1400, a third conductive pattern 1500, a fourth conductive pattern 1600, and a fifth conductive pattern 1700. The first organic film layer PI1, the first barrier layer BRR1, and the second organic film layer PI2 may constitute a substrate SUB. A first lower pattern (e.g., a first lower pattern LP1 in FIG. 19), a second lower pattern (e.g., a second lower pattern LP2 in FIG. 19), and a third lower pattern (e.g., a third lower pattern LP3 in FIG. 19) may be provided in the lower pattern layer LPL. Insulation layers may be disposed between the first active pattern 1100 to the fifth conductive pattern 1700. In addition, a second via-insulating layer VIA2 may be disposed on the fifth conductive pattern 1700, and each of the first and second pixel electrodes ADE1 and ADE2 may be connected to the fifth conductive pattern 1700 through contact holes penetrating the second via-insulating layer VIA2.

A conventional display device includes a display panel, and transistors including an active pattern are disposed in the display panel. An electric field may be generated inside the display panel by signals and voltages provided to the display panel. Organic materials included in the organic film layer included in the display panel may be polarized by the electric field. The polarized organic materials may have an electrical effect on the active pattern(s) included in the display panel. Accordingly, electrical characteristics of the transistors may be changed. In addition, the polarization phenomenon may be further accelerated by light incident to the display panel. For this reason, the display quality of the conventional display device may be deteriorated.

However, the display device 10 according to the invention may include the lower pattern layer LPL disposed inside the display panel 100. The first lower pattern provided in the lower pattern layer LPL may prevent the polarization phenomenon from electrically affecting the first and second active patterns 1100 and 1400. Accordingly, electrical characteristics of the transistors may not be changed. Therefore, the display quality of the display device 10 may be improved.

In addition, the second lower pattern and the third lower pattern may prevent an electric breakdown phenomenon that may occur in a process of forming the first lower pattern. It will be described in detail below.

FIG. 6 to FIG. 17 are layout diagrams illustrating the display device of FIG. 1. FIG. 18 is a cross-sectional view taken along line I-I' of FIG. 17.

Referring to FIGS. 5 and 6, the display device 10 may include a plurality of pixel circuit parts arranged in a matrix shape. In an embodiment, the display device 10 may include the first and second pixel circuit parts PCP1 and PCP2 arranged in the first direction D1, for example. In an embodiment, the second pixel circuit part PCP2 may have a shape symmetrical to a shape of the first pixel circuit part PCP1.

Figure 7:
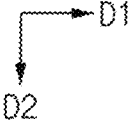
Figure 8:
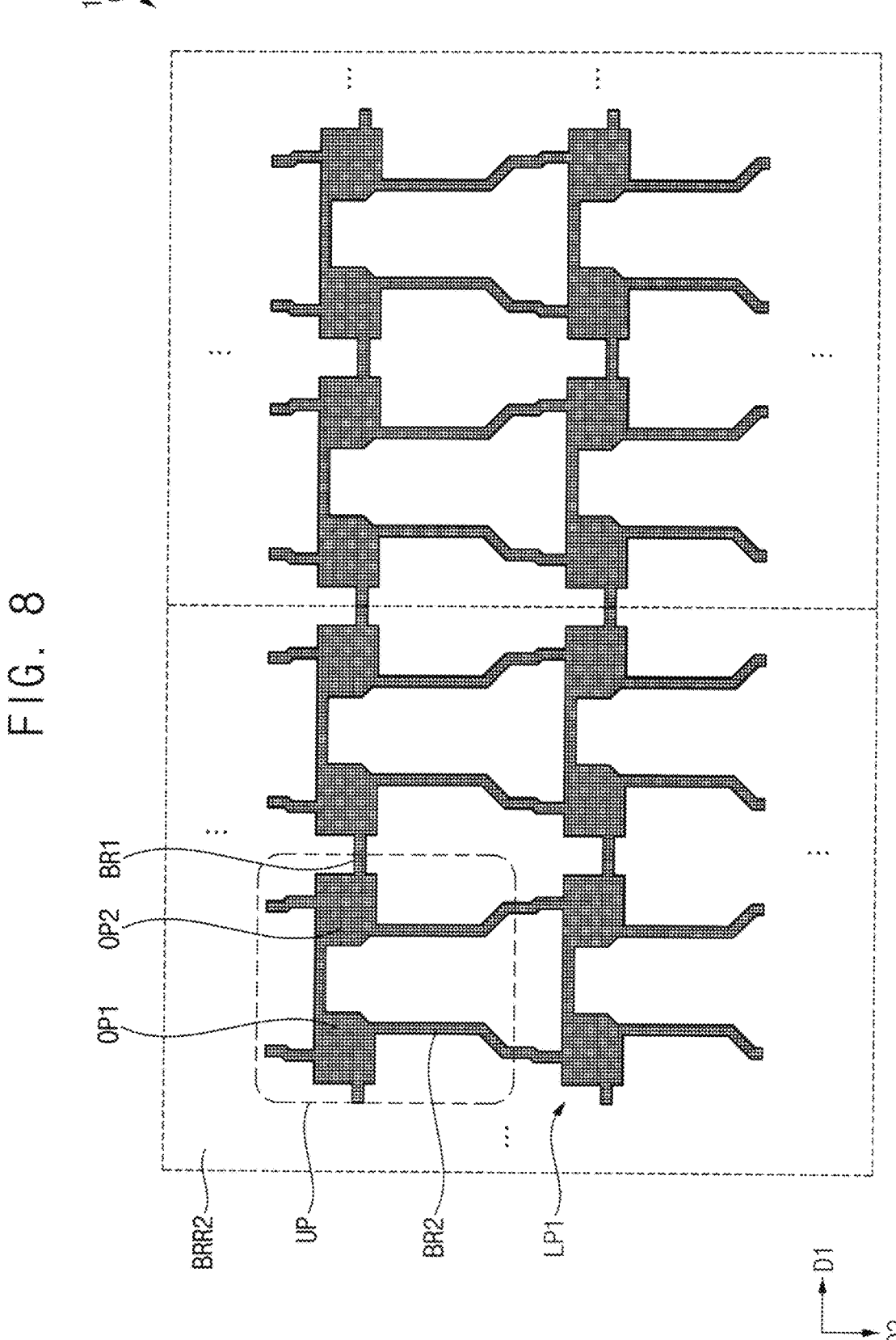

Referring to FIGS. 4, 7 and 8, the first barrier layer BRR1 may be disposed on the first organic film layer PI1, the second organic film layer PI2 may be disposed on the first barrier layer BRR1, the second barrier layer BRR2 may be disposed on the second organic film layer PI2, and the first lower pattern LP1 may be disposed on the second barrier layer BRR2.

The first organic film layer PI1 and the second organic film layer PI2 may include an organic material. In an embodiment, the first organic film layer PI1 and the second organic film layer PI2 may include at least one of polyimide, polyethersulfone, polyacrylate, polyetherimide, polyethylene naphthalate, polyethylene terephthalate, polyphenylene sulfide, polyarylate, polycarbonate, and cellulose acetate propionate, for example.

The first barrier layer BRR1 and the second barrier layer BRR2 may include an inorganic material. In an embodiment, the first barrier layer BRR1 and the second barrier layer BRR2 may include at least one of silicon oxide, silicon nitride, silicon oxynitride, amorphous silicon, and the like, for example. In an embodiment, the second barrier layer BRR2 may protect the second organic film layer PI2, which may be damaged in the process of forming the first lower pattern LP1.

In an embodiment, the first lower pattern LP1 may be entirely disposed in the display area DA. In an embodiment, as shown in FIG. 8, the first lower pattern LP1 may have a shape in which a plurality of unit patterns UP are repeatedly arranged, for example. The first lower pattern LP1 may include a plurality of overlap patterns OP, a plurality of first bridges BR1, and a plurality of second bridges BR2.

In an embodiment, each of the overlap patterns OP may have an island shape. In addition, the overlap patterns OP may include a first overlap pattern OP1 and a second overlap pattern OP2. The second overlap pattern OP2 may be symmetrical with the first overlap pattern OP1 in the first direction D1. The first overlap pattern OP1 and the second overlap pattern OP2 may be alternately arranged along the first direction D1. In addition, the first overlap pattern OP1 may be arranged side by side along the second direction D2, and the second overlap pattern OP2 may be arranged side by side along the second direction D2.

In an embodiment, the first bridges BR1 may extend in the first direction D1 and may connect the overlap patterns OP to each other. In an embodiment, the first bridges BR1 may connect the first overlap pattern OP1 and the second overlap pattern OP2 which are alternately arranged along the first direction D1, for example.

In an embodiment, the second bridges BR2 may extend in the second direction D2 and may connect the overlap patterns OP to each other. In an embodiment, the second bridges BR2 may connect the first overlap pattern OP1 arranged side by side along the second direction D2, and may connect the second overlap pattern OP2 arranged side by side along the second direction D2, for example.

As the first lower pattern LP1 includes the overlap patterns OP, the first bridges BR1 extending in the first direction D1, and the second bridges BR2 extending in the second direction D2, the first lower pattern LP1 may have a mesh shape.

In an embodiment, the first lower pattern LP1 may include metal. In an embodiment, the lower pattern may include the same metal (e.g., molybdenum ("Mo")) as that of the first conductive pattern 1200, for example.

In another embodiment, the first lower pattern LP1 may include a silicon semiconductor. In an embodiment, the first lower pattern LP1 may include amorphous silicon or polycrystalline silicon, for example. In addition, the first lower pattern LP1 may be doped with positive or negative ions. In an embodiment, the positive ions may include a group III element, boron, or the like. The negative ions may include a group V element, phosphorus, or the like, for example.

In an embodiment, a constant voltage (e.g. a direct current ("DC") voltage) may be provided to the first lower pattern LP1. In an embodiment, the power voltage ELVDD may be provided to the first lower pattern LP1, for example. In another embodiment, the first lower pattern LP1 may be electrically floating. In another embodiment, an alternating current ("AC") voltage may be provided to the first lower pattern LP1.

Figure 9:
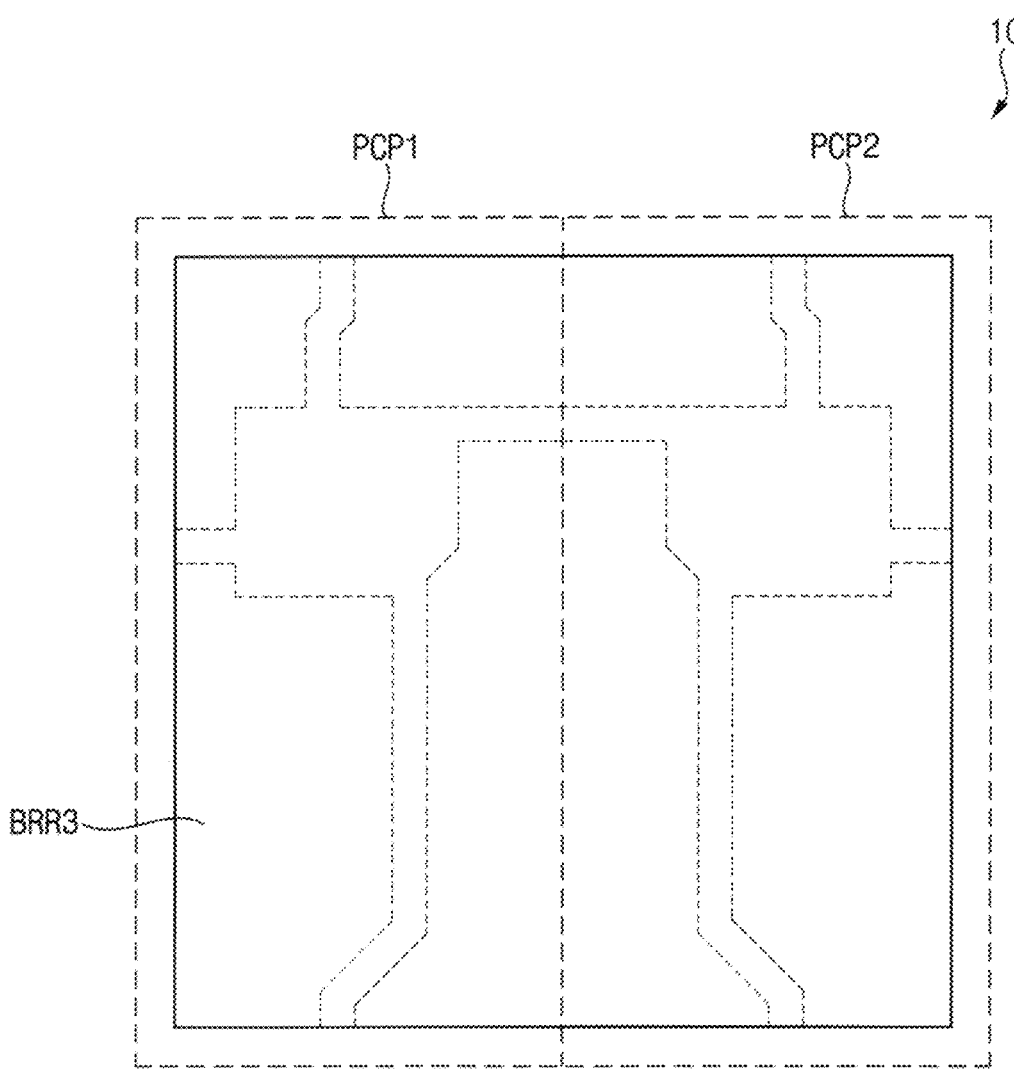
Figure 9:
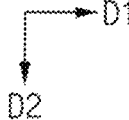

Referring to FIGS. 4 and 9, the third barrier layer BRR3 may be disposed on the first lower pattern LP1. The third barrier layer BRR3 may cover the first lower pattern LP1.

The third barrier layer BRR3 may include the same material as that of the first barrier layer BRR1 and/or the second barrier layer BRR2.

Figure 10:
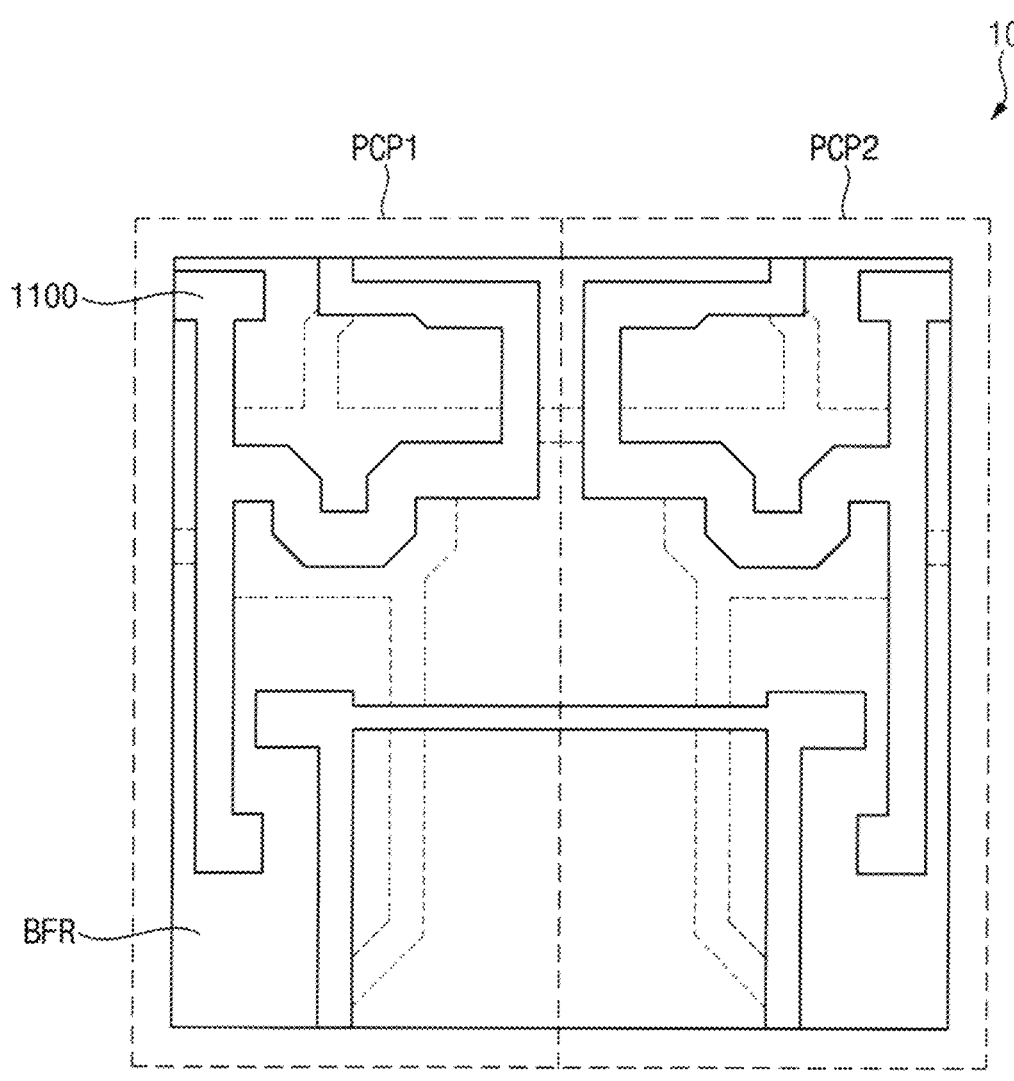
Figure 10:
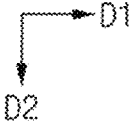

Referring to FIGS. 4 and 10, a buffer layer BFR may be disposed on the third barrier layer BRR3, and the first active pattern 1100 may be disposed on the buffer layer BFR.

The buffer layer BFR may prevent metal atoms or impurities from diffusing into the first active pattern 1100. In addition, the buffer layer BFR may control a rate of transferring a heat during a crystallization process for forming the first active pattern 1100.

The first active pattern 1100 may overlap the first lower pattern LP1. In an embodiment, the first active pattern 1100 may include a silicon semiconductor. In an embodiment, the first active pattern 1100 may include amorphous silicon, polycrystalline silicon, or the like, for example.

In an embodiment, positive ions or negative ions may be selectively injected into the first active pattern 1100. In an embodiment, when the first, second, fifth, sixth, and seventh transistors T1, T2, T5, T6, and T7 are the PMOS transistors, the first active pattern 1100 may include a source region having a high concentration of positive ions, a drain region having a high concentration of positive ions, and a channel region having a low concentration of positive ions, for example.

A first gate insulating layer GI1 (refer to FIG. 12) may cover the first active pattern 1100 and may be disposed on the buffer layer BFR. The first gate insulating layer GI1 may include an insulating material. In an embodiment, the first gate insulating layer GI1 may have a single layer or multilayer structure including silicon oxide, silicon nitride, silicon oxynitride, or the like, for example.

Figure 11:
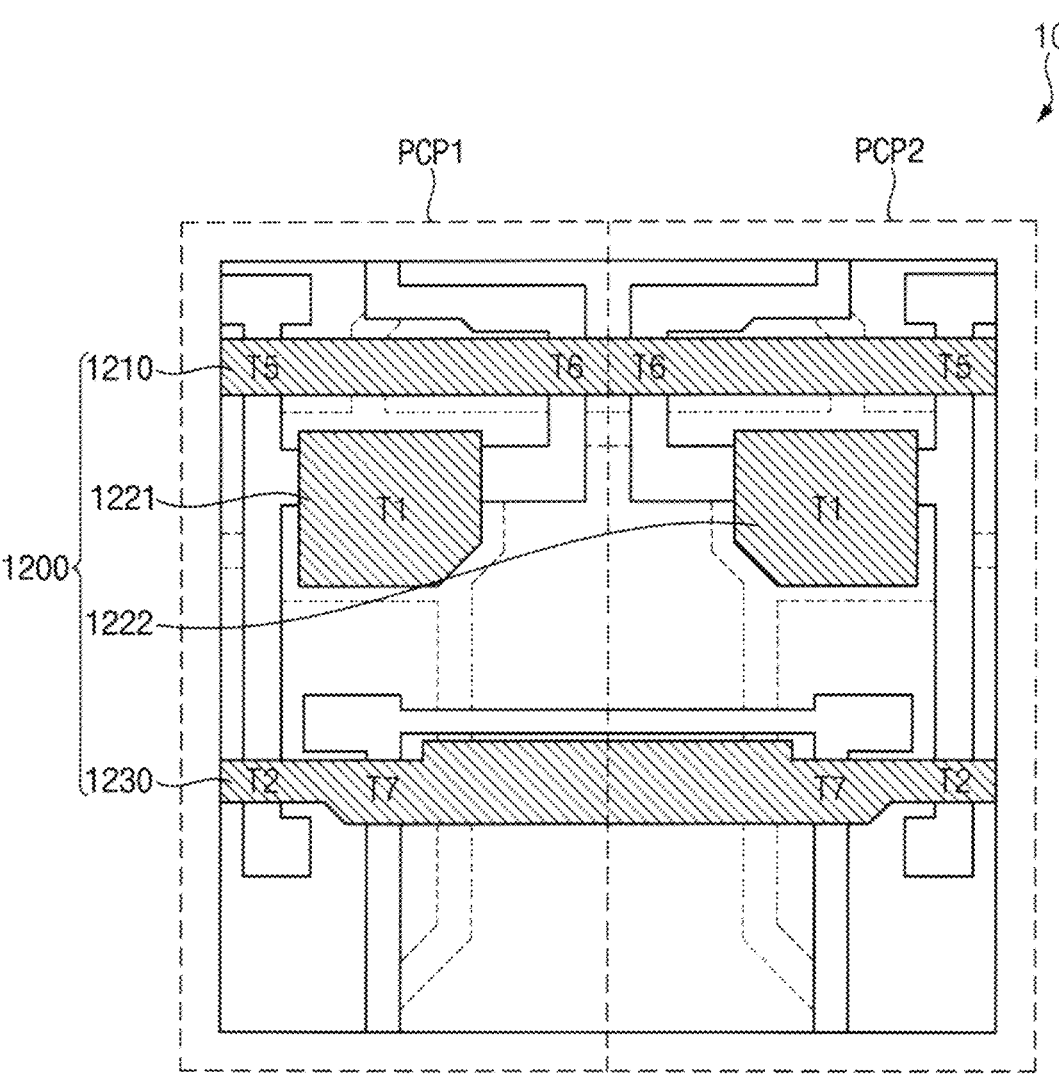
Figure 11:
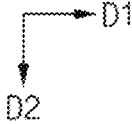
Figure 12:
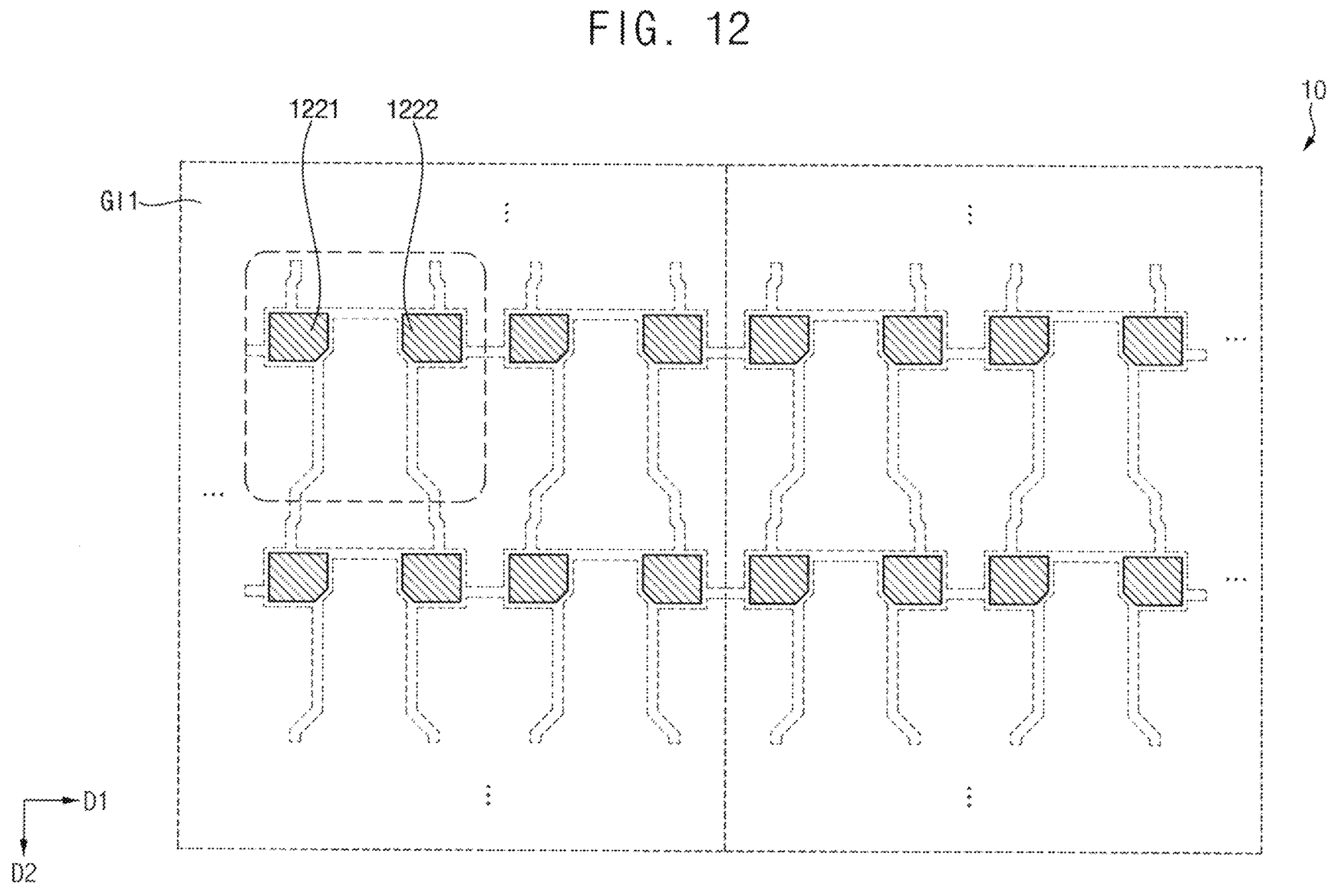

Referring to FIGS. 4, 11, and 12, the first conductive pattern 1200 may be disposed on the first gate insulating layer GI1. The first conductive pattern 1200 may include a first gate line 1210, a first gate electrode 1221, a second gate electrode 1222, and a fourth gate line 1230.

The first gate line 1210 may be disposed on the first active pattern 1100 and may extend in the first direction D1. In an embodiment, the first gate line 1210 may be adjacent to one side of the first gate electrode 1221 in a plan view. The first gate line 1210 may constitute the fifth and sixth transistors T5 and T6 together with the first active pattern 1100. The emission management signal EM may be provided to the first gate line 1210. In an embodiment, the first gate line 1210 may be also referred to as an emission management line, for example.

The plurality of gate electrodes may be arranged in a matrix shape. The gate electrodes may be disposed for each of the pixel circuit parts. In an embodiment, the gate electrodes may overlap the overlap patterns OP. In an embodiment, the gate electrodes may include the first gate electrode 1221 and the second gate electrode 1222, for example. The first gate electrode 1221 may overlap the first overlap pattern OP1, and the second gate electrode 1222 may overlap the second overlap pattern OP2.

The first gate electrode 1221 may constitute the first transistor T1 included in the first pixel circuit part PCP1 together with the first active pattern 1100. The second gate electrode 1222 may constitute a first transistor T1 included in the second pixel circuit part PCP2 together with the first active pattern 1100.

The fourth gate line 1230 may be disposed on the first active pattern 1100 and may extend in the first direction D1. In an embodiment, the fourth gate line 1230 may form the second transistor T2 together with the first active pattern 1100, for example. The first gate signal GW may be provided to the fourth gate line 1230.

In addition, the fourth gate line 1230 may constitute the seventh transistor T7 together with the first active pattern 1100. The fourth gate signal GB may be provided to the fourth gate line 1230. In an embodiment, the first gate signal GW and the fourth gate signal GB may have substantially the same waveform with a time difference, for example.

In an embodiment, the first conductive pattern 1200 may include a metal including at least one of molybdenum ("Mo"), aluminum ("Al"), copper ("Cu"), titanium ("Ti"), an alloy, a conductive metal oxide, a transparent conductive material, etc., for example.

A second gate insulating layer GI2 (refer to FIG. 18) may cover the first conductive pattern 1200 and may be disposed on the first gate insulating layer GI1. In an embodiment, the second gate insulating layer GI2 may have a single layer or multilayer structure including silicon oxide, silicon nitride, silicon oxynitride, or the like, for example.

The first, second, fifth, sixth, and seventh transistors T1, T2, T5, T6, and T7 may substantially correspond to the first, second, fifth, sixth, and seventh transistors T1, T2, T5, T6, and T7 described with reference to FIG. 3. In an embodiment, the first gate electrode 1221 may correspond to the gate terminal of the first transistor T1 described with reference to FIG. 3, for example. However, the above-described correspondence will be apparent to those skilled in the art of the invention.

Figure 13:
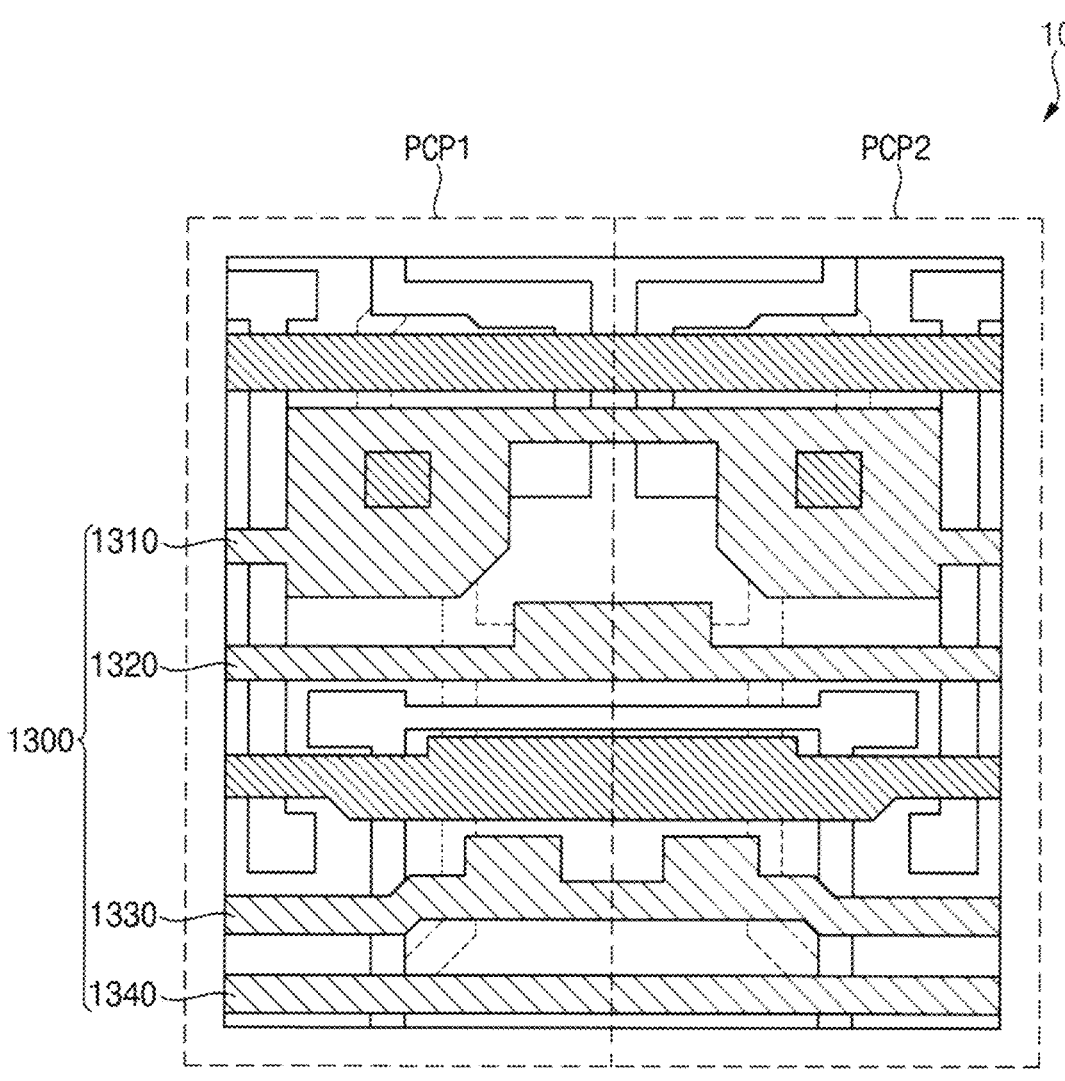
Figure 13:
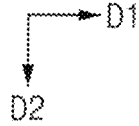

Referring to FIGS. 4 and 13, the second conductive pattern 1300 may be disposed on the second gate insulating layer GI2. The second conductive pattern 1300 may include a storage capacitor electrode 1310, a second gate line 1320, a fifth gate line 1330, and a gate initialization voltage line 1340.

The storage capacitor electrode 1310 may extend in the first direction D1. In an embodiment, the storage capacitor electrode 1310 may constitute the storage capacitor CST included in the first pixel circuit part PCP1 together with the first gate electrode 1221. In an embodiment, the storage capacitor electrode 1310 may overlap the first gate electrode 1221, and the power voltage ELVDD may be provided to the storage capacitor electrode 1310, for example. In addition, the storage capacitor electrode 1310 may constitute the storage capacitor CST included in the second pixel circuit part PCP2 together with the second gate electrode 1222. In an embodiment, the storage capacitor electrode 1310 may overlap the second gate electrode 1222, for example.

In an embodiment, openings exposing upper surfaces of the first and second gate electrodes 1221 and 1222 may be defined in the storage capacitor electrode 1310.

The second gate line 1320 may extend in the first direction D1. In an embodiment, the second gate line 1320 may be adjacent to the other side opposite to the one side of the first gate electrode 1221 in a plan view. In an embodiment, the second gate line 1320 may provide the second gate signal GC to the third transistor T3. In an embodiment, the second gate line 1320 may correspond to the bottom gate terminal of the third transistor T3. The second gate line 1320 may be also referred to as a bottom compensation control line, for example.

The fifth gate line 1330 may extend in the first direction D1. In an embodiment, the fifth gate line 1330 may provide the third gate signal GI to the fourth transistor T4. In an embodiment, the fifth gate line 1330 may correspond to the bottom gate terminal of the fourth transistor T4, for example.

The gate initialization voltage line 1340 may extend in the first direction D1. In an embodiment, the gate initialization voltage line 1340 may provide the gate initialization voltage VINT to the fourth transistor T4. In an embodiment, the gate initialization voltage line 1340 may be electrically connected to the second active pattern 1400, for example.

In an embodiment, the second conductive pattern 1300 may include a metal including at least one of molybdenum ("Mo"), aluminum ("Al"), copper ("Cu"), titanium ("Ti"), an alloy, a conductive metal oxide, a transparent conductive material, etc., for example.

A first inter-insulating layer ILD1 (refer to FIG. 18) may cover the second conductive pattern 1300 and may be disposed on the second gate insulating layer GI2. The first inter-insulating layer ILD1 may include an insulating material.

Figure 14:
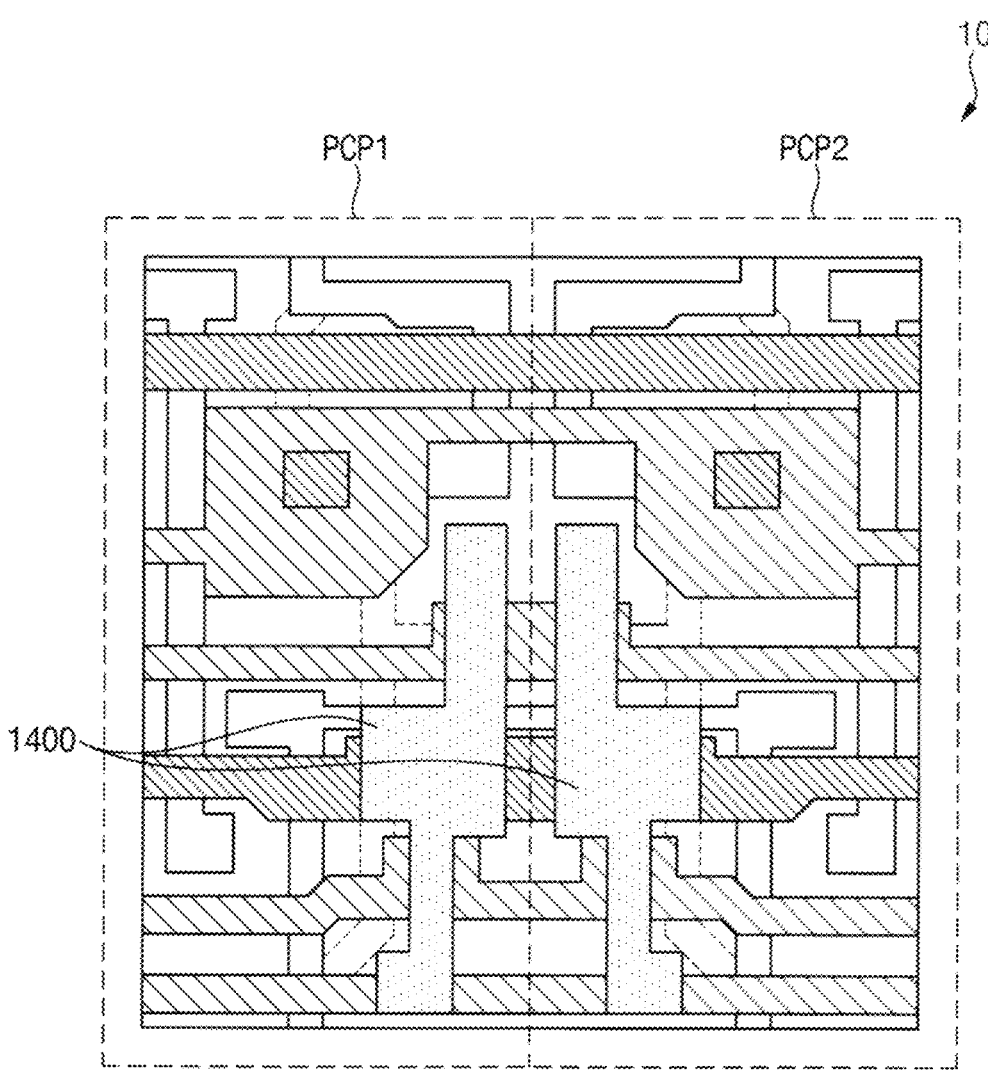
Figure 14:
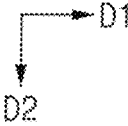

Referring to FIGS. 4 and 14, the second active pattern 1400 may be disposed on the first inter-insulating layer ILD1. In an embodiment, the second active pattern 1400 may overlap the second gate line 1320, the fifth gate line 1330, and the gate initialization voltage line 1340, for example.

In an embodiment, the second active pattern 1400 may be disposed in a different layer from the first active pattern 1100. In other words, the second active pattern 1400 may be provided separately from the first active pattern 1100. In an embodiment, the first active pattern 1100 may include the silicon semiconductor, and the second active pattern 1400 may include an oxide semiconductor, for example.

In an embodiment, the first pixel circuit part PCP1 may include the first, second, fifth, sixth, and seventh transistors T1, T2, T5, T6, and T7, which are silicon-based semiconductor transistors, and the third and fourth transistors T3 and T4, which are oxide-based semiconductor transistors. In an embodiment, the first, second, fifth, sixth, and seventh transistors T1, T2, T5, T6, and T7 may be the PMOS transistors, and the third and fourth transistors T3 and T4 may be the NMOS transistors, for example.

A third gate insulating layer GI3 (refer to FIG. 18) may cover the second active pattern 1400 and may be disposed on the first inter-insulating layer ILD1. In an embodiment, the third gate insulating layer GI3 may have a single layer or multilayer structure including silicon oxide, silicon nitride, silicon oxynitride, or the like, for example.

Figure 15:
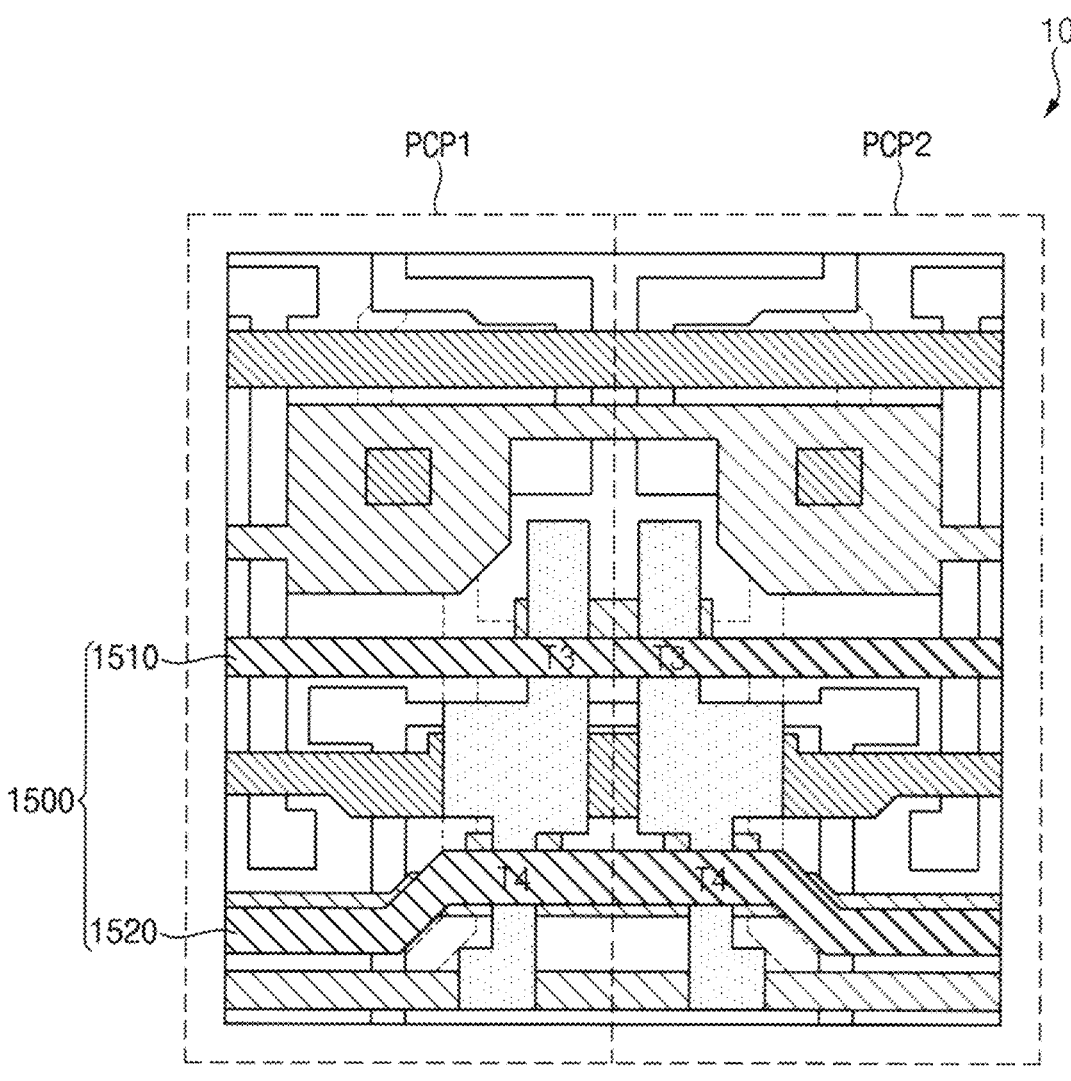
Figure 15:
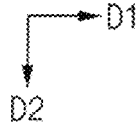

Referring to FIGS. 4 and 15, the third conductive pattern 1500 may be disposed on the third gate insulating layer GI3. The third conductive pattern 1500 may include a third gate line 1510 and a sixth gate line 1520.

The third gate line 1510 may extend in the first direction D1. In an embodiment, the third gate line 1510 may overlap the second gate line 1320 and may be electrically connected to the second gate line 1320, for example. In an embodiment, the third gate line 1510 may provide the second gate signal GC to the third transistor T3. Accordingly, the third gate line 1510 may correspond to the gate terminal of the third transistor T3. The third gate line 1510 may be also referred to as a top compensation control line.

The sixth gate line 1520 may extend in the first direction D1. In an embodiment, the sixth gate line 1520 may overlap the fifth gate line 1330 and may be electrically connected to the fifth gate line 1330, for example. In an embodiment, the sixth gate line 1520 may provide the third gate signal GI to the fourth transistor T4. Accordingly, the sixth gate line 1520 may correspond to the gate terminal of the fourth transistor T4.

A second inter-insulating layer ILD2 (refer to FIG. 18) may cover the third conductive pattern 1500 and may be disposed on the first inter-insulating layer ILD1. The second inter-insulating layer ILD2 may include an insulating material.

Figure 16:
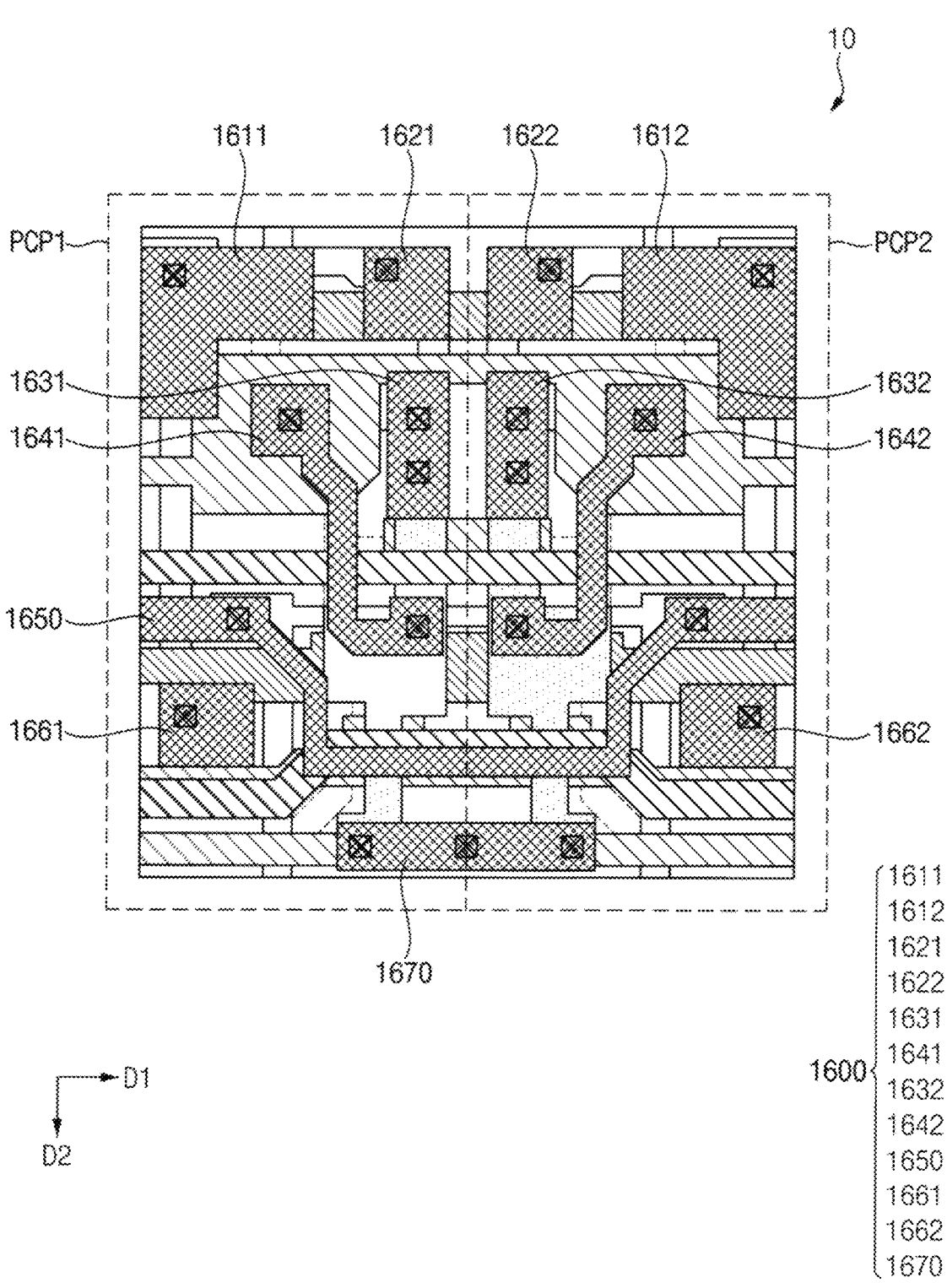

Referring to FIGS. 4 and 16, the fourth conductive pattern 1600 may be disposed on the second inter-insulating layer ILD2. The fourth conductive pattern 1600 may include a first power voltage connection pattern 1611, a second power voltage connection pattern 1612, a first anode pattern 1621, a second anode pattern 1622, and a first compensation connection pattern 1631, a second compensation connection pattern 1632, a first initialization connection pattern 1641, a second initialization connection pattern 1642, an anode initialization voltage line 1650, a first data pattern 1661, a second data pattern 1662, and a gate initialization voltage pattern 1670.

The first and second power voltage connection patterns 1611 and 1612 may transmit the power voltage ELVDD to the first active pattern 1100. In an embodiment, the first and second power voltage connection patterns 1611 and 1612 may electrically connect a power voltage line (e.g., a power voltage line 1720 in FIG. 17) and the first active pattern 1100. In an embodiment, the first and second power voltage connection patterns 1611 and 1612 may contact the power voltage line 1720 and the first active pattern 1100, for example.

The first anode pattern 1621 may provide the anode initialization voltage AINT or the driving current to the first emitting diode ED1 connected to the first pixel circuit part PCP1. In an embodiment, the first anode pattern 1621 may contact the first active pattern 1100 and a third anode pattern (e.g., a third anode pattern 1731 in FIG. 17), for example.

The second anode pattern 1622 may provide the anode initialization voltage AINT or the driving current to the second emitting diode ED2 connected to the second pixel circuit part PCP2. In an embodiment, the second anode pattern 1622 may contact the first active pattern 1100 and the fourth anode pattern (e.g., a fourth anode pattern 1732 in FIG. 17), for example.

The first compensation connection pattern 1631 may electrically connect the second terminal of the first transistor T1 and the first terminal of the third transistor T3 which are included in the first pixel circuit part PCP1. In an embodiment, the first compensation connection pattern 1631 may contact the first active pattern 1100 and the second active pattern 1400, for example.

The second compensation connection pattern 1632 may electrically connect the second terminal of the first transistor T1 and the first terminal of the third transistor T3 which are included in the second pixel circuit part PCP2. In an embodiment, the second compensation connection pattern 1632 may contact the first active pattern 1100 and the second active pattern 1400, for example.

The first initialization connection pattern 1641 may electrically connect the gate terminal of the first transistor T1 and the first terminal of the fourth transistor T4 which are included in the first pixel circuit part PCP1. In an embodiment, the first initialization connection pattern 1641 may contact the second active pattern 1400 and the first gate electrode 1221, for example.

The second initialization connection pattern 1642 may electrically connect the gate terminal of the first transistor T1 and the first terminal of the fourth transistor T4 which are included in the second pixel circuit part PCP2. In an embodiment, the second initialization connection pattern 1642 may contact the second active pattern 1400 and the second gate electrode 1222, for example.

The anode initialization voltage line 1650 may provide the anode initialization voltage AINT to the seventh transistor T7. In an embodiment, the anode initialization voltage line 1650 may contact the first active pattern 1100, for example.

The first data pattern 1661 may provide the data voltage DATA to the second transistor T2 included in the first pixel circuit part PCP1. In an embodiment, the first data pattern 1661 may contact the first active pattern 1100 and a first data line (e.g., a first data line 1711 in FIG. 17), for example.

The second data pattern 1662 may provide the data voltage DATA to the second transistor T2 included in the second pixel circuit part PCP2. In an embodiment, the second data pattern 1662 may contact the first active pattern 1100 and a second data line (e.g., a second data line 1712 in FIG. 17), for example.

The gate initialization voltage pattern 1670 may provide the gate initialization voltage VINT to the fourth transistor T4. In an embodiment, the gate initialization voltage pattern 1670 may provide the gate initialization voltage VINT to the second active pattern 1400, for example. The gate initialization voltage pattern 1670 may contact the gate initialization voltage line 1340 and the second active pattern 1400.

The fourth conductive pattern 1600 may contact the conductive pattern or the active pattern disposed under the fourth conductive pattern 1600 through a plurality of contact holes.

A first via-insulating layer VIA1 (refer to FIG. 18) may cover the fourth conductive pattern 1600 and may be disposed on the second inter-insulating layer ILD2. The first via-insulating layer VIA1 may include an organic insulating material. In an embodiment, the first via-insulating layer VIA1 may include a photoresist, a polyacrylic resin, a polyimide resin, an acrylic resin, or the like, for example.

Figure 17:
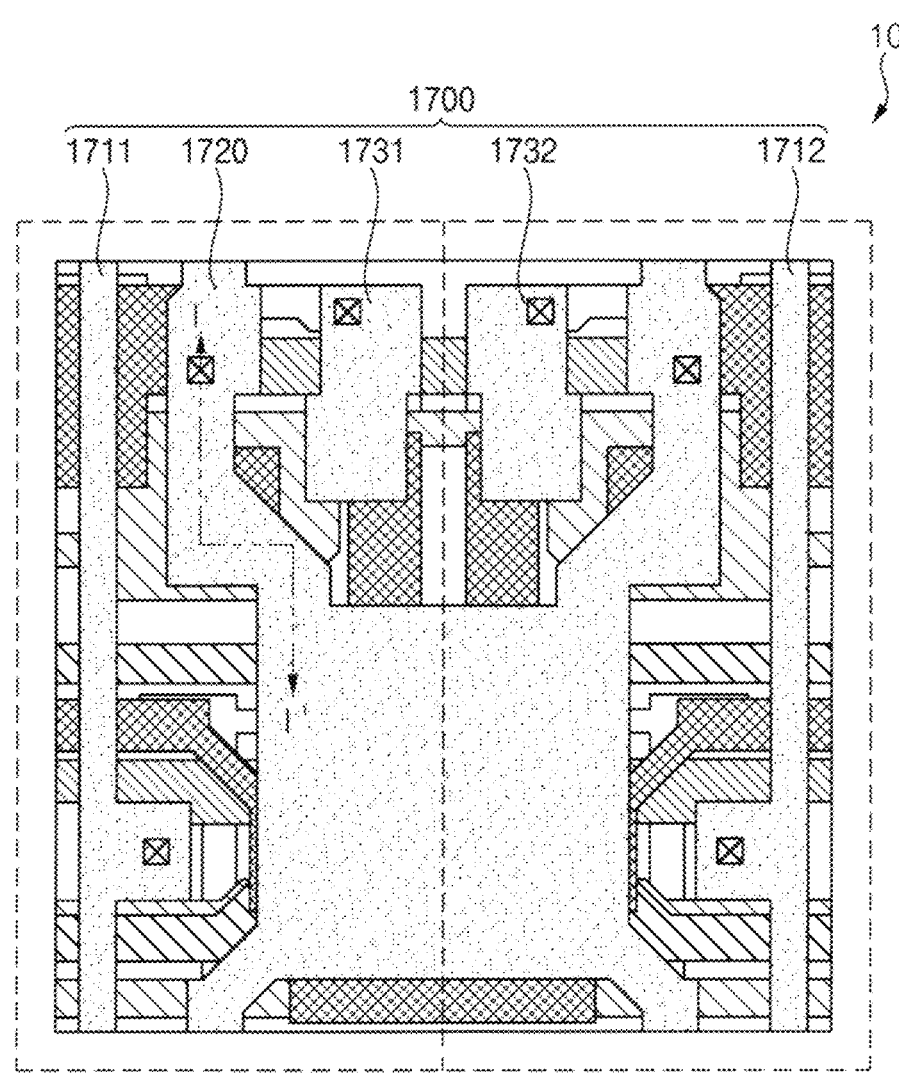
Figure 17:
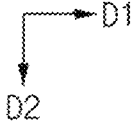
Figure 18:
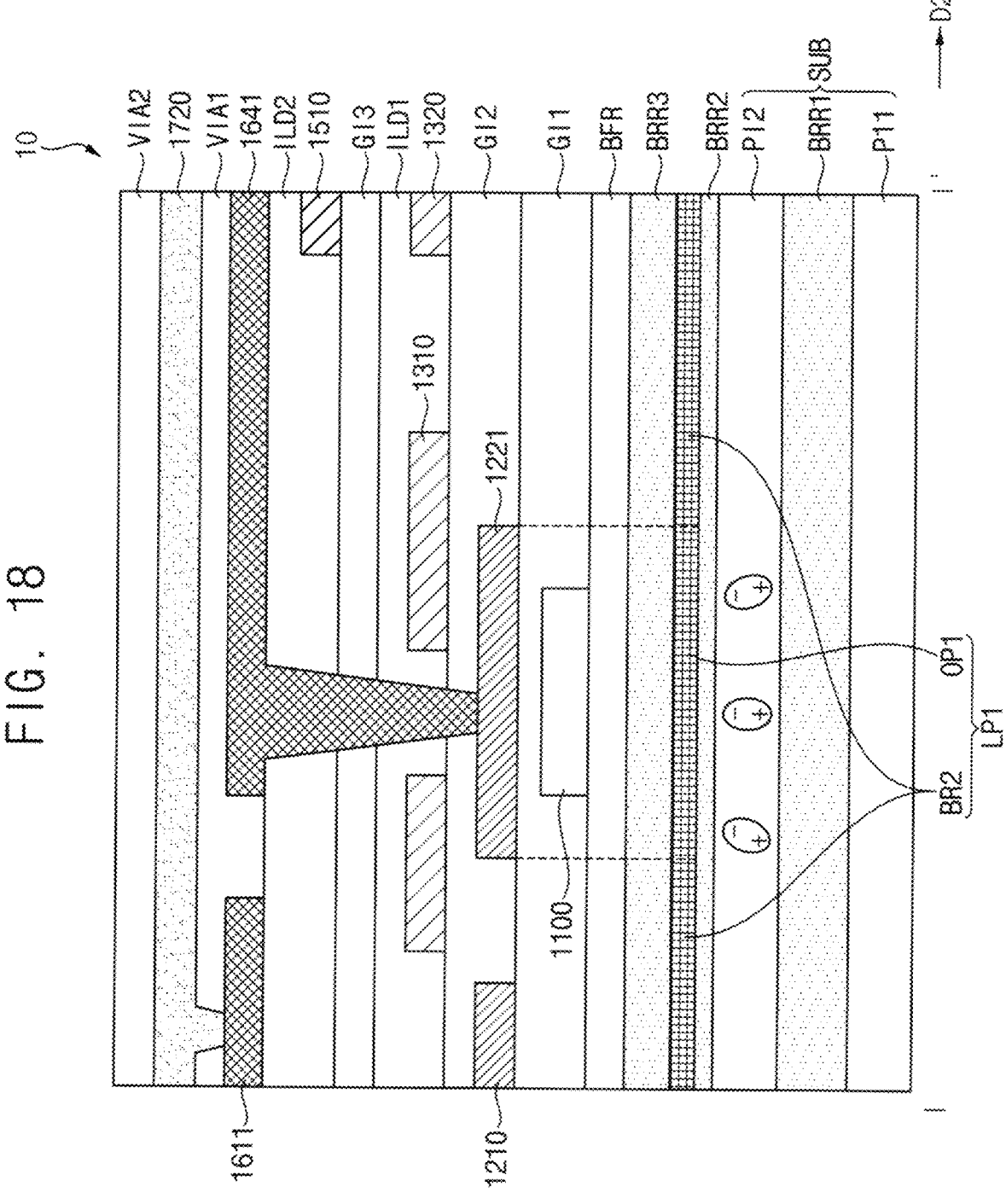
FIG. 18 is a cross-sectional view taken along line I-I' of FIG. 17.

Referring to FIGS. 4 and 17, the fifth conductive pattern 1700 may be disposed on the first via-insulating layer VIA1. The fifth conductive pattern 1700 may include a first data line 1711, a second data line 1712, a power voltage line 1720, a third anode pattern 1731, and a fourth anode pattern 1732.

The first data line 1711 may extend in the second direction D2. In an embodiment, the first data line 1711 may provide the data voltage DATA to the second transistor T2 included in the first pixel circuit part PCP1. In an embodiment, the first data line 1711 may contact the first data pattern 1661, for example.

The second data line 1712 may extend in the second direction D2. In an embodiment, the second data line 1712 may provide the data voltage DATA to the second transistor T2 included in the second pixel circuit part PCP2. In an embodiment, the second data line 1712 may contact the second data pattern 1662, for example.

The power voltage line 1720 may extend in the second direction D2. In an embodiment, the power voltage line 1720 may provide the power voltage ELVDD to the first and second power voltage connection patterns 1611 and 1612. In an embodiment, the power voltage line 1720 may contact the first and second power voltage connection patterns 1611 and 1612, for example.

The third anode pattern 1731 may provide the anode initialization voltage AINT or the driving current to the first emitting diode ED1 connected to the first pixel circuit part PCP1. In an embodiment, the third anode pattern 1731 may contact the first anode pattern 1621, for example.

The fourth anode pattern 1732 may provide the anode initialization voltage AINT or the driving current to the second emitting diode ED2 connected to the second pixel circuit part PCP2. In an embodiment, the fourth anode pattern 1732 may contact the second anode pattern 1622, for example.

The second via-insulating layer VIA2 may cover the fifth conductive pattern 1700 and may be disposed on the first via-insulating layer VIA1. The second via-insulating layer VIA2 may include an organic insulating material. In an embodiment, the second via-insulating layer VIA2 may include a photoresist, a polyacrylic resin, a polyimide resin, an acrylic resin, or the like, for example.

Referring to FIGS. 17 and 18, the first lower pattern LP1 may overlap the first active pattern 1100, the first gate electrode 1221, and the power voltage line 1720. In detail, the first overlap pattern OP1 may overlap the first active pattern 1100 and the first gate electrode 1221, and the second bridges BR2 may overlap the power voltage line 1720. In addition, in a plan view, the first gate line 1210 may be adjacent to the one side of the first gate electrode 1221, and the second gate line 1320 and the third gate line 1510 may be adjacent to the other side of the first gate electrode 1221.

As described above, the emission management signal EM may be provided to the first gate line 1210, and the second gate signal GC may be provided to the second gate line 1320 and the third gate line (also referred to as a third gate wire) 1510. In order to turn on the fifth and sixth transistors T5 and T6, the emission management signal EM may have a negative voltage level. At the same time, in order to turn off the third transistor T3, the second gate signal GC may have a negative voltage level.

In a conventional display device, as the emission management signal EM and the second gate signal GC have the negative voltage level at the same time, an electric field may be generated in the second organic film layer PI2. Accordingly, organic materials included in the second organic film layer PI2 may be polarized. A back channel may be defined in the first active pattern 1100 by the polarized organic materials. Accordingly, electrical characteristics (e.g., threshold voltage, electron mobility, etc.) of the first transistor T1 may be changed. Accordingly, the first and second pixel structures including the first transistor T1 having electrical characteristics that are changed may emit luminance not corresponding to the data voltage DATA, and display quality of the display device may be deteriorated.

However, the display device 10 may include the first lower pattern LP1 disposed between the second organic film layer PI2 and the first active pattern 1100. The first lower pattern LP1 may shield the first active pattern 1100 from the polarized organic materials. Accordingly, the back channel may not be defined in the first active pattern 1100 and electrical characteristics of the first transistor T1 may not be changed. Accordingly, the display quality of the display device 10 may be improved.

In addition, as described above, the first lower pattern LP1 may have the mesh shape. In an embodiment, the first lower pattern LP1 may be arranged by repeating a unit pattern, for example. As the first lower pattern LP1 has the mesh shape, the first lower pattern LP1 may effectively suppress the polarization of the organic materials.

Figure 19:
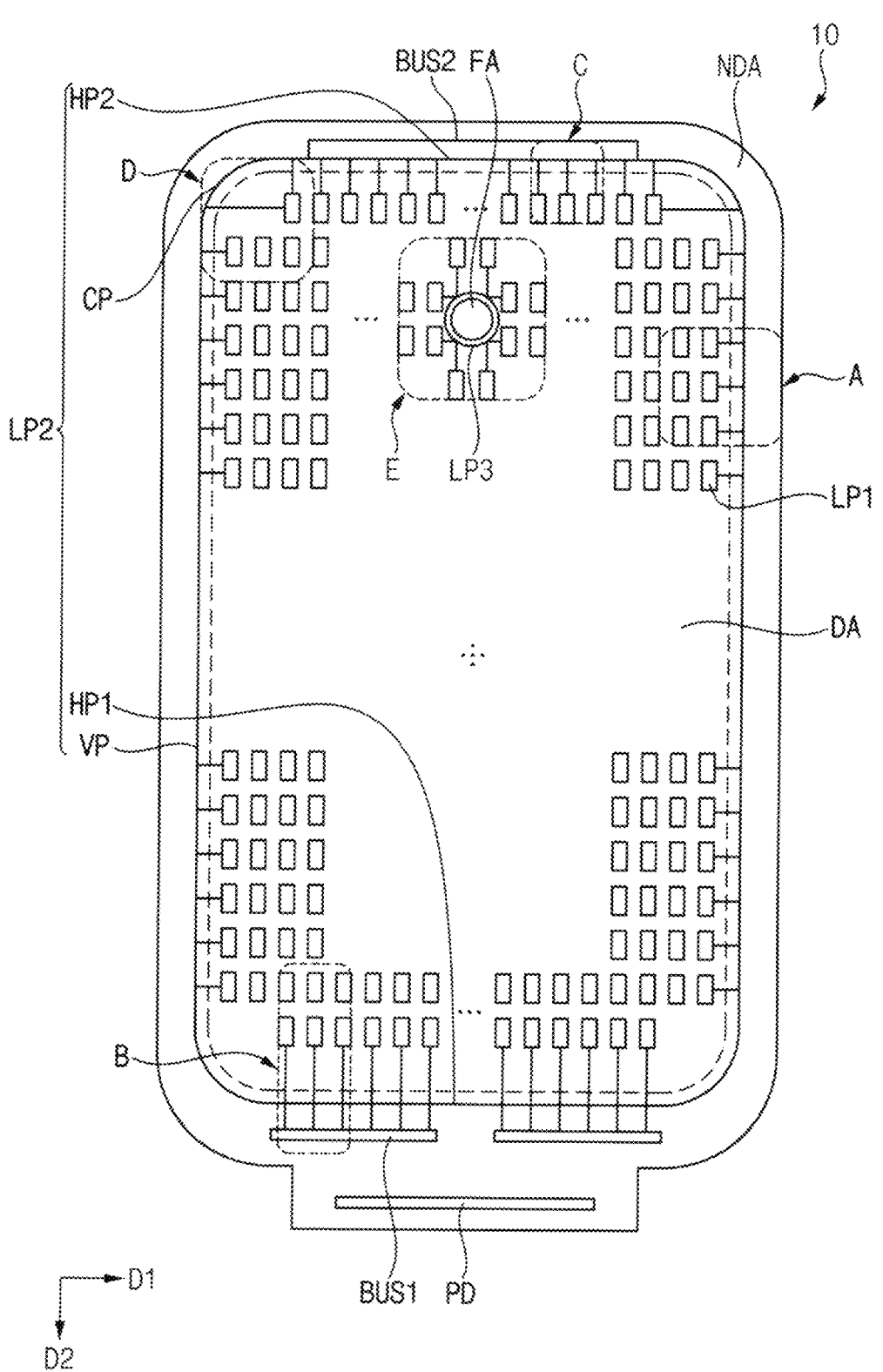
FIG. 19 is a plan view illustrating a first lower pattern, a second lower pattern, and a third lower pattern included in the display device of FIG. 1.

FIG. 19 is a plan view illustrating a first lower pattern, a second lower pattern, and a third lower pattern included in the display device of FIG. 1.

Referring to FIG. 19, the display device 10 may include the first lower pattern LP1, the second lower pattern LP2, and the third lower pattern LP3. The first lower pattern LP1 and the third lower pattern LP3 may be disposed in the display area DA, and the second lower pattern LP2 may be disposed in the non-display area NDA.

As described above, the first lower pattern LP1 may include the unit patterns UP (refer to FIG. 8) connected to each other. In addition, the first lower pattern LP1 may have the mesh shape and may be entirely disposed in the display area DA. Among the unit patterns UP, first unit patterns may be disposed at an edge of the mesh shape (e.g., an area A in FIG. 19), the second unit patterns may be disposed at a bottom of the mesh shape (e.g., an area B in FIG. 19), the third unit patterns may be disposed at a top of the mesh shape (e.g. an area C in FIG. 19), the fourth unit patterns may be disposed at corners of the mesh shape (e.g., an area D of FIG. 19), and the fifth unit patterns may be adjacent to the hole area FA (e.g., an area E in FIG. 19).

In an embodiment, the second lower pattern LP2 may be disposed in the lower pattern layer LPL together with the first lower pattern LP1. In an embodiment, the second lower pattern LP2 may be unitary with the first lower pattern LP1, for example.

In addition, the second lower pattern LP2 may be connected to the first lower pattern LP1 and may surround the first lower pattern LP1. In an embodiment, the second lower pattern LP2 may have a closed curve shape. In an embodiment, the second lower pattern LP2 may have a quadrangular (e.g., rectangular) shape with rounded corners. In another embodiment, the second lower pattern LP2 may have an open curve shape, for example. In an embodiment, the second lower pattern LP2 may have a quadrangular (e.g., rectangular) shape in which at least one of the corners is cut off, for example. However, the shape of the second lower pattern LP2 is not limited to the above. As described later, the second lower pattern LP2 may cover a protruding portion of the first lower pattern LP1.

In an embodiment, the second lower pattern LP2 may include a vertical pattern VP, a first horizontal pattern HP1, a second horizontal pattern HP2, and a corner pattern CP. The vertical pattern VP may be disposed at the edge of the mesh shape and may extend in the second direction D2. The first horizontal pattern HP1 may be disposed at the bottom of the mesh shape and may extend in the first direction D1. The second horizontal pattern HP2 may be disposed at the top of the mesh shape and may extend in the first direction D1. The corner pattern CP may be disposed at a corner of the mesh shape, and may connect the vertical pattern VP and the second horizontal pattern HP2 (or the first horizontal pattern HP1).

In an embodiment, the third lower pattern LP3 may be disposed in the lower pattern layer LPL together with the first lower pattern LP1. In an embodiment, the third lower pattern LP3 may be unitary with the first lower pattern LP1, for example. In addition, the third lower pattern LP3 may be connected to the first lower pattern LP1 and may have a closed curve shape surrounding the hole area FA. In an embodiment, the third lower pattern LP3 may have the same circular shape as the hole area FA, for example.

Figure 20:
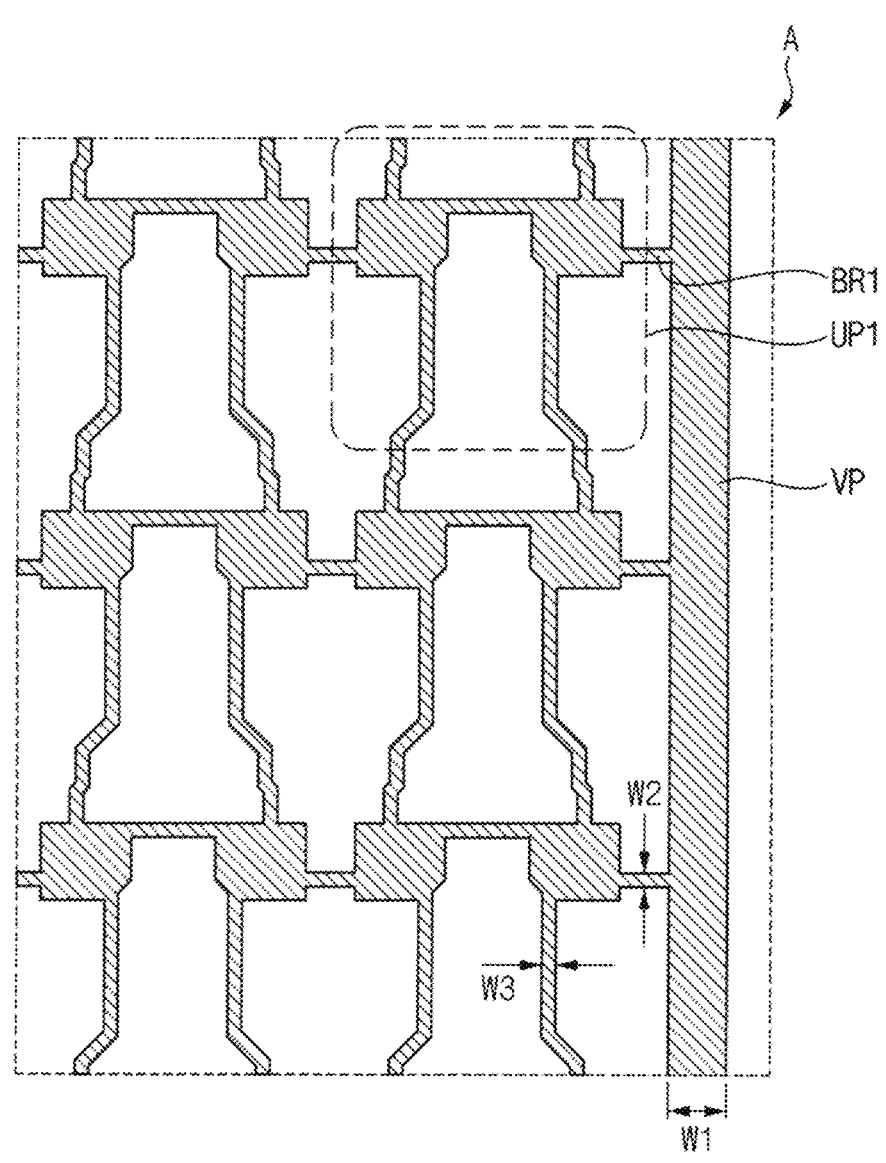
FIG. 20 is an enlarged view illustrating an embodiment of area A of FIG. 19.
Figure 20:
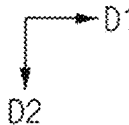

FIG. 20 is an enlarged view illustrating an embodiment of area A of FIG. 19.

Referring to FIGS. 19 and 20, the second lower pattern LP2 may include the vertical pattern VP extending in the second direction D2. The vertical pattern VP may be connected to the first unit patterns UP1 disposed at the edge of the mesh shape among the unit patterns UP. In detail, the vertical pattern VP may be connected to the first bridges BR1 included in the first unit patterns UP1.

In an embodiment, the vertical pattern VP may have a constant first width W1 in the first direction D1. In an embodiment, the first width W1 may be smaller than about 4 micrometers (μm), for example. In addition, each of the first bridges BR1 may have a second width W2 in the second direction D2. In an embodiment, the second width W2 may be about 2.2 μm, for example. In an embodiment, each of the second bridges BR2 may have a third width W3 in the first direction D1. In an embodiment, the first width W1 may be about 1.8 times or more greater than the second width W2, for example. As the first width W1 is greater than the second width W2, a static electricity dissipation effect of the second lower pattern LP2 may be improved.

Figure 21:
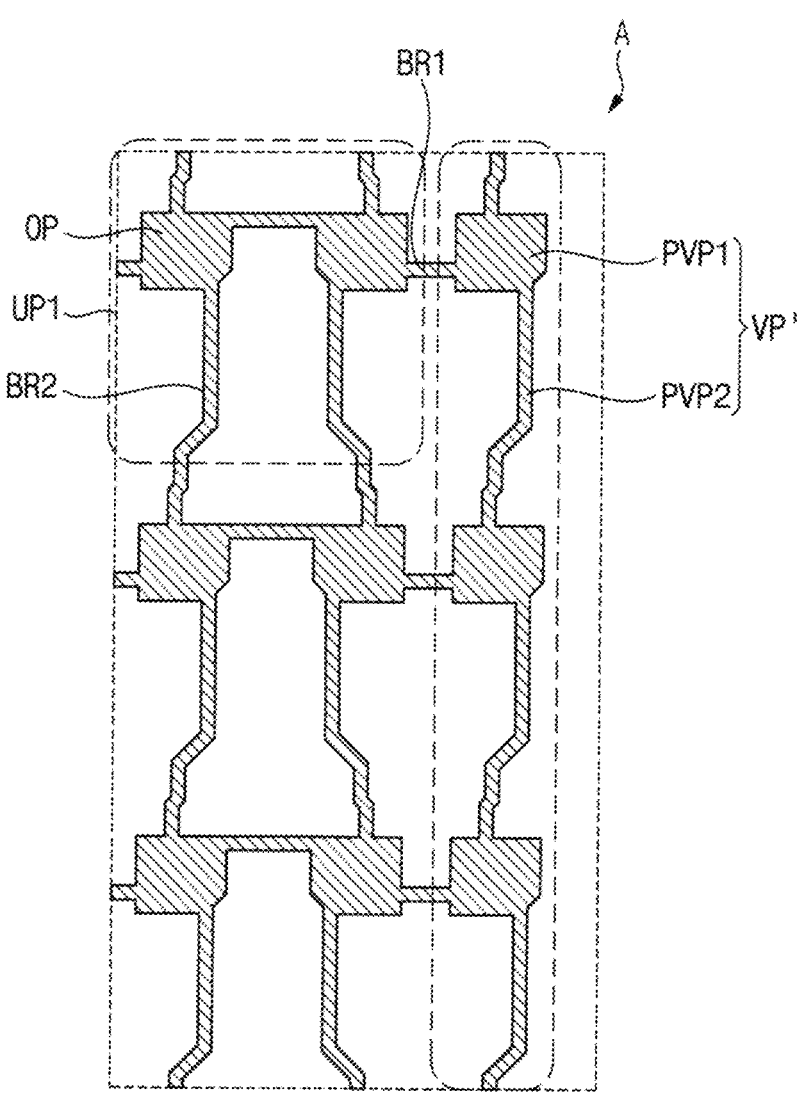
FIG. 21 is an enlarged view illustrating another embodiment of area A of FIG. 19.
Figure 21:
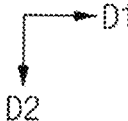

Referring to FIGS. 19 and 21, the second lower pattern LP2 may include a vertical pattern VP' extending in the second direction D2. The vertical pattern VP' may be connected to the first unit patterns UP1 disposed at the edge of the mesh shape among the unit patterns UP. In detail, the vertical pattern VP' may be connected to the first bridges BR1 included in the first unit patterns UP1.

In an embodiment, the vertical pattern VP' may include first partial vertical patterns PVP1 and second partial vertical patterns PVP2. The first partial vertical patterns PVP1 may have the same shape as a shape of the overlap patterns OP. The second partial vertical patterns PVP2 may have the same shape as a shape of the second bridges BR2. Accordingly, the width of the vertical pattern VP' in the first direction D1 may not be constant. In addition, in this case, the vertical pattern VP' may be disposed in the display area DA.

Figure 22:
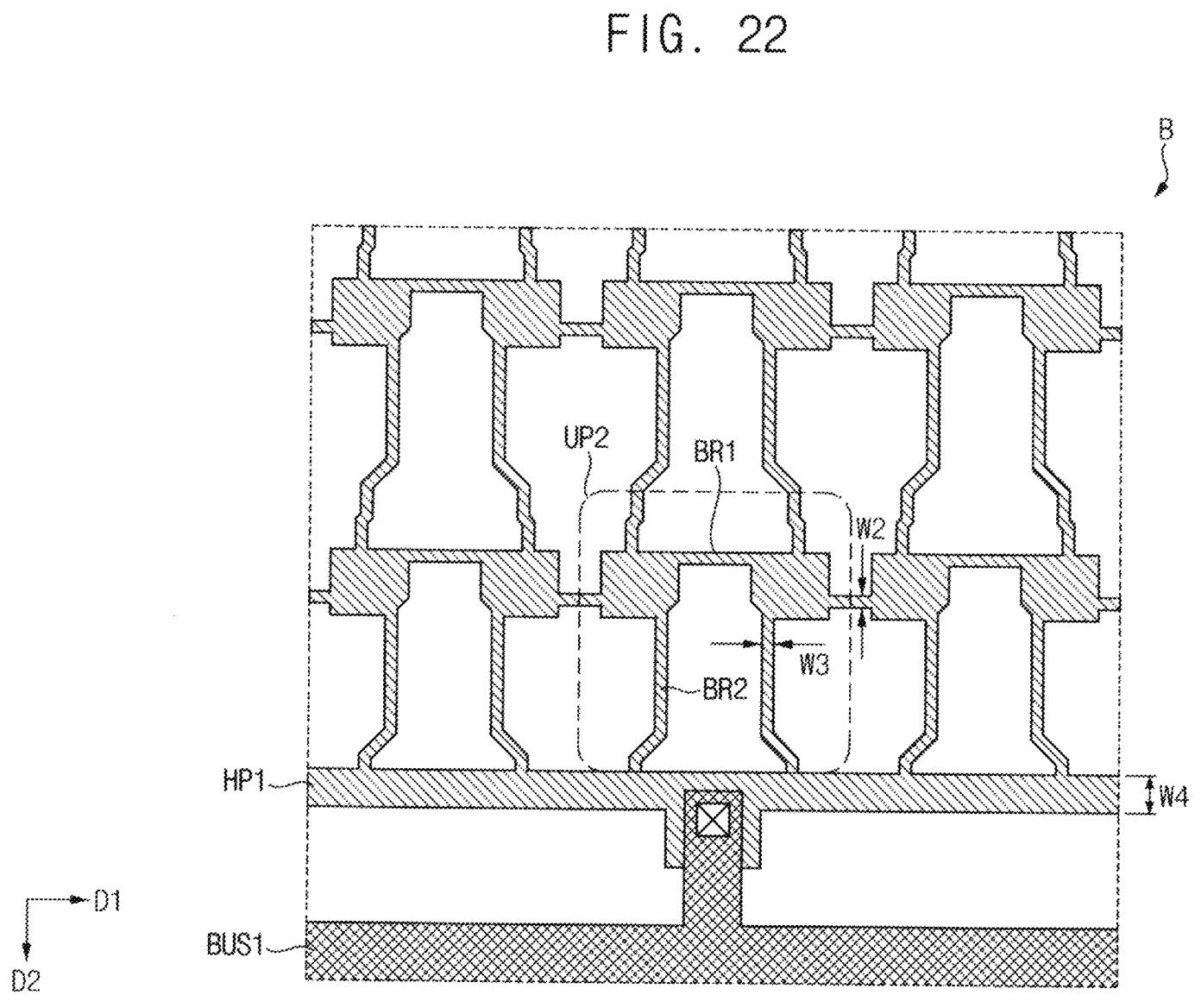

FIG. 22 is an enlarged view illustrating an embodiment of area B of FIG. 19.

Referring to FIGS. 19 and 22, the second lower pattern LP2 may include the first horizontal pattern HP1 extending in the second direction D2. The first horizontal pattern HP1 may be connected to the second unit patterns UP2 disposed at the bottom of the mesh shape among the unit patterns UP. In detail, the first horizontal pattern HP1 may be connected to the second bridges BR2 included in the second unit patterns UP2.

In an embodiment, the first horizontal pattern HP1 may have a fourth width W4 in the second direction D2. The fourth width W4 may be greater than the second width W2 and the third width W3. In an embodiment, the fourth width W4 may be smaller than about 4 μm. In addition, the first horizontal pattern HP1 may be connected to the power voltage bus BUS1, and the power voltage ELVDD may be provided to the first horizontal pattern HP1, for example. In an embodiment, the power voltage bus BUS1 may be disposed in the same layer as the fourth conductive pattern 1600.

Figure 23:
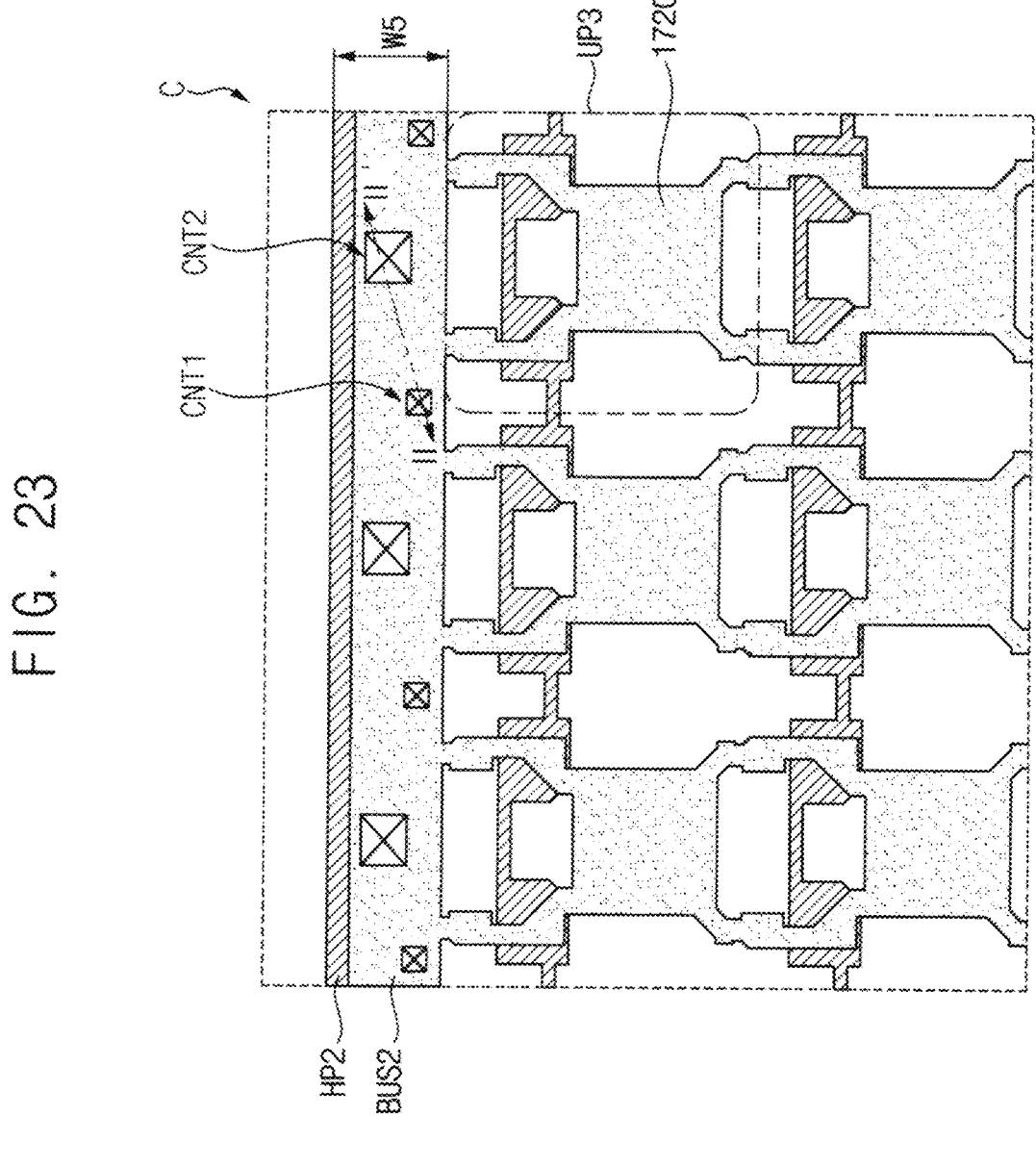
FIG. 23 is an enlarged view illustrating an embodiment of area C of FIG. 19.
Figure 24:
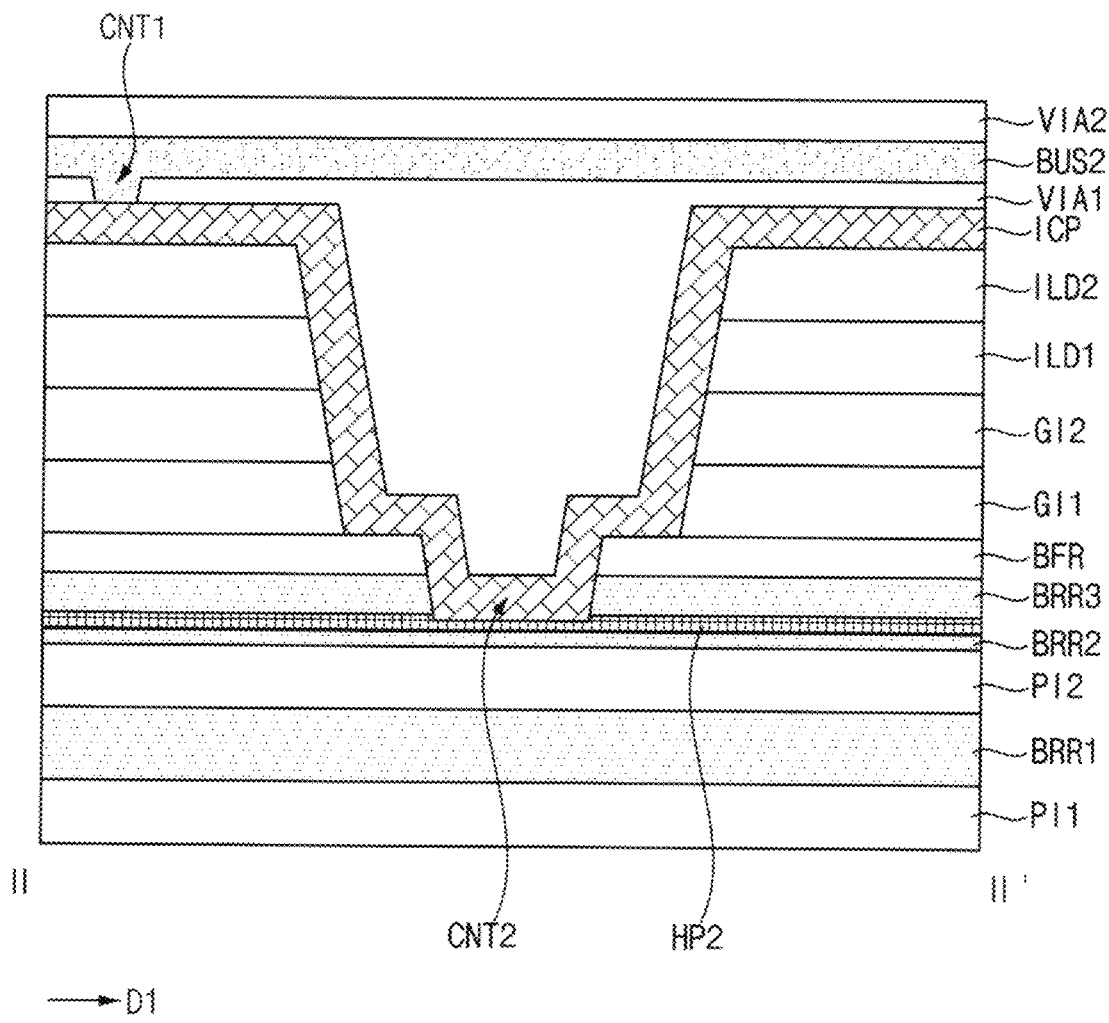
FIG. 24 is a cross-sectional view taken along line II-II' of FIG. 23.

FIG. 23 is an enlarged view illustrating an embodiment of area C of FIG. 19. FIG. 24 is a cross-sectional view taken along line II-II' of FIG. 23.

Referring to FIGS. 19 and 23, the second lower pattern LP2 may include the second horizontal pattern HP2 extending in the first direction D1. The second horizontal pattern HP2 may be connected to the third unit patterns UP3 disposed at the top of the mesh shape among the unit patterns UP. In detail, the second horizontal pattern HP2 may be connected to the second bridges BR2 included in the third unit patterns UP3. In an embodiment, the second horizontal pattern HP2 may have a constant fifth width W5 in the second direction D2. The fifth width W5 may be greater than the second width W2 and the third width W3.

Referring to FIGS. 23 and 24, the second horizontal pattern HP2 may contact an intermediate connection pattern ICP through a second contact hole CNT2, and the intermediate connection pattern ICP may be contact the power voltage pattern BUS2 through a first contact hole CNT1. In an embodiment, the intermediate connection pattern ICP may be disposed in the same layer as the fourth conductive pattern 1600, and the power voltage pattern BUS2 may be provided together with the power voltage line 1720. The first contact hole CNT1 may penetrate the first via-insulating layer VIA1. The second contact hole CNT2 may be spaced apart from the first contact hole CNT1, and may penetrate the third barrier layer BRR3, the buffer layer BFR, the first gate insulating layer GI1, and the second gate insulating layer GI2, the first inter-insulating layer ILD1, the third gate insulating layer GI3, and the second inter-insulating layer ILD2. Accordingly, the power voltage pattern BUS2 may be electrically connected to the second horizontal pattern HP2.

In an embodiment, the power voltage pattern BUS2 may be unitary with a power voltage line included in the third pixel PX3. The power voltage pattern BUS2 may transmit the power voltage ELVDD to the power voltage line included in the third pixel PX3.

In addition, the second horizontal pattern HP2 may transmit the power voltage ELVDD to the unit patterns UP included in the first lower pattern LP1. Accordingly, the second horizontal pattern HP2 may reduce a voltage drop of the power voltage ELVDD applied to the unit patterns UP.

Figure 25:
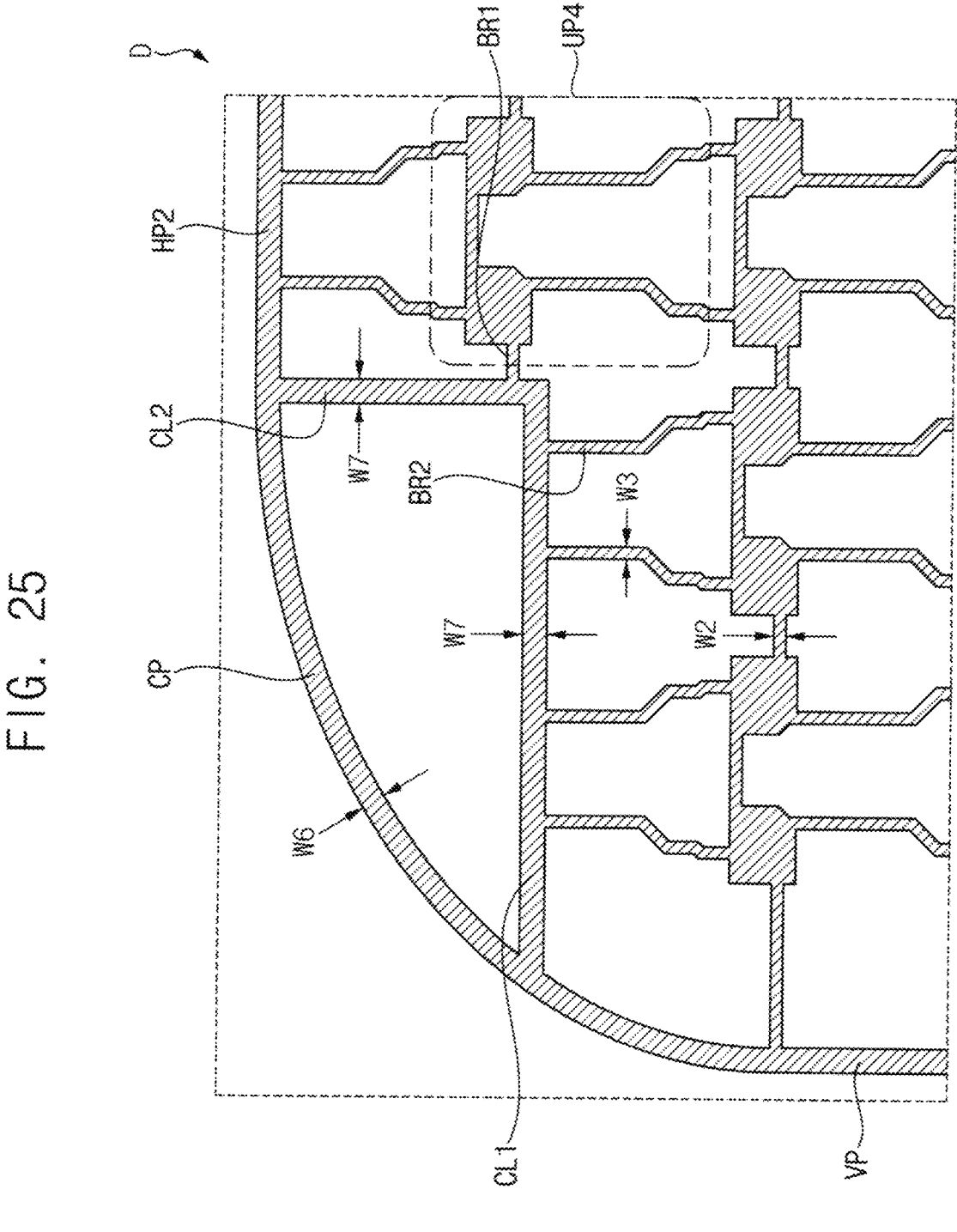
FIG. 25 is an enlarged view illustrating an embodiment of area D of FIG. 19.
Figure 26:
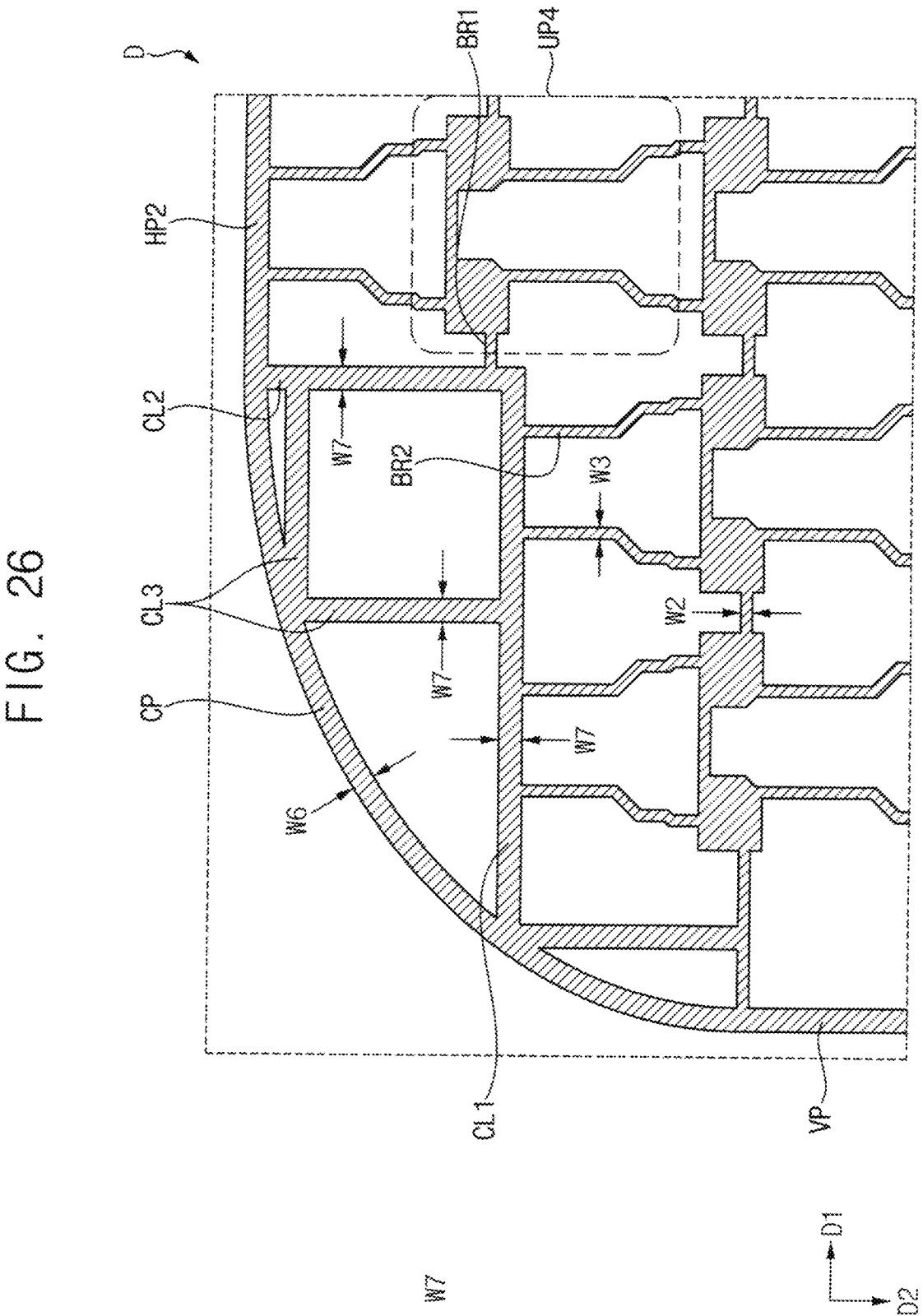
FIG. 26 is an enlarged view illustrating another embodiment of area D of FIG. 19.
Figure 27:
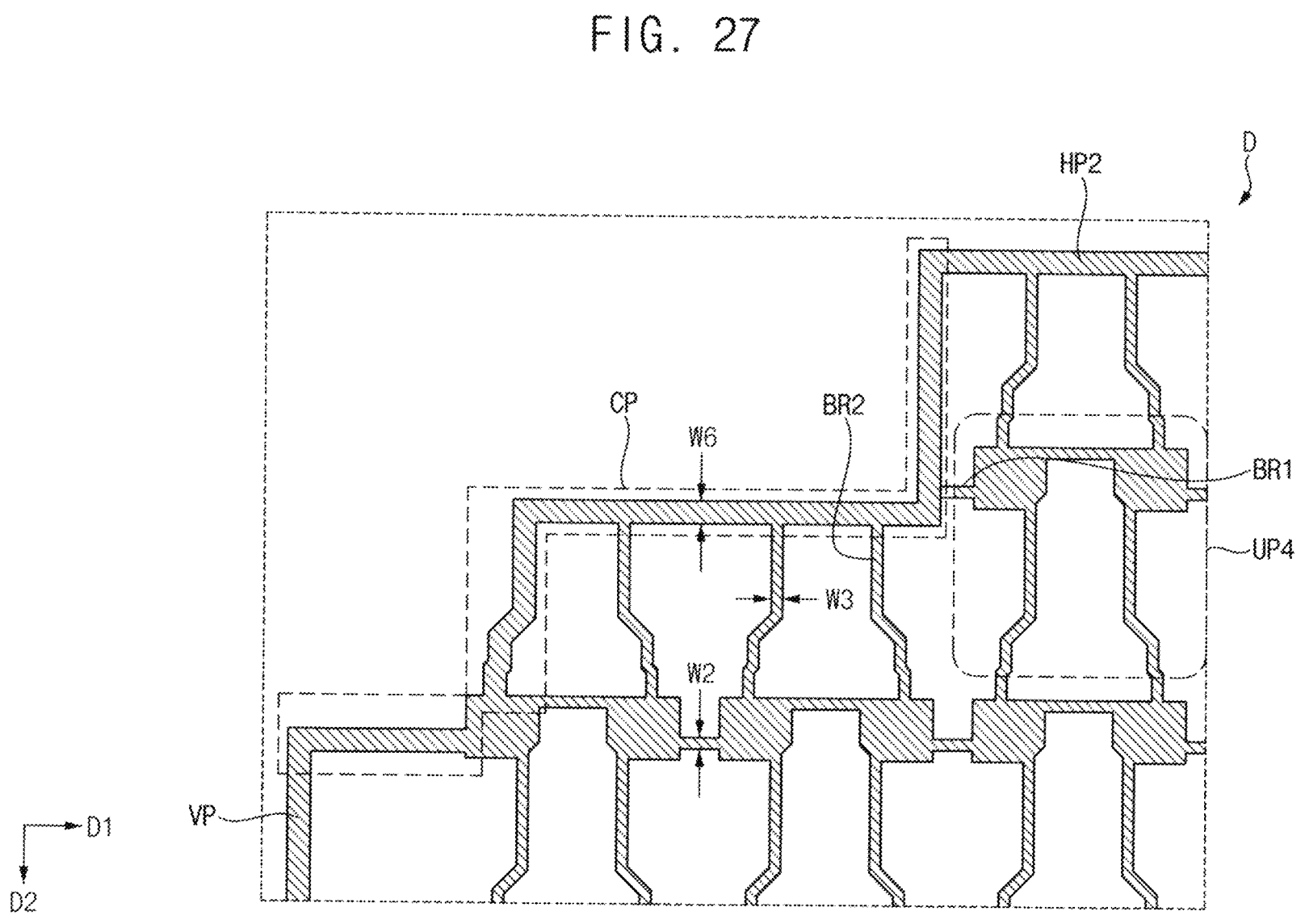

FIG. 25 is an enlarged view illustrating an embodiment of area D of FIG. 19. FIG. 26 is an enlarged view illustrating another embodiment of area D of FIG. 19. FIG. 27 is an enlarged view illustrating still another embodiment of area D of FIG. 19.

Referring to FIGS. 19 and 25, the second lower pattern LP2 may include the corner pattern CP connecting the vertical pattern VP and the second horizontal pattern HP2 (or the first horizontal pattern HP1. The corner pattern CP may be connected to the fourth unit patterns UP4 disposed at the corner of the mesh shape among the unit patterns UP.

In detail, the display device 10 may further include a first connection line CL1 and a second connection line CL2. The first connection line CL1 may extend in the first direction D1 and may connect the corner pattern CP and the second bridges BR2 adjacent to the corner pattern CP. The second connection line CL2 may extend in the second direction D2 and may connect the corner pattern CP and the first bridges BR1 adjacent to the corner pattern CP.

In an embodiment, the corner pattern CP may have a sixth width W6. In an embodiment, the sixth width W6 may be smaller than about 4 μm, for example. In addition, each of the first connection line CL1 and the second connection line CL2 may have a seventh width W7. The seventh width W7 may be smaller than about 4 μm. In an embodiment, the sixth width W6 and the seventh width W7 may be about 1.8 times greater than the second width W2, for example. In another embodiment, the first connection line CL1 and the second connection line CL2 may have different widths from each other.

Referring to FIGS. 19 and 26, the display device 10 may include the first connection line CL1, the second connection line CL2, and a third connection line CL3. The third connection line CL3 may connect the first connection line CL1, the second connection line CL2, and the corner pattern CP.

Referring to FIGS. 19 and 27, the second lower pattern LP2 may include the corner patterns CP extending in the first direction D1 and the second direction D2, respectively. The corner pattern CP may connect the vertical pattern VP and the second horizontal pattern HP2 (or the first horizontal pattern HP1), and may be connected to the fourth unit patterns UP4.

Figure 28:
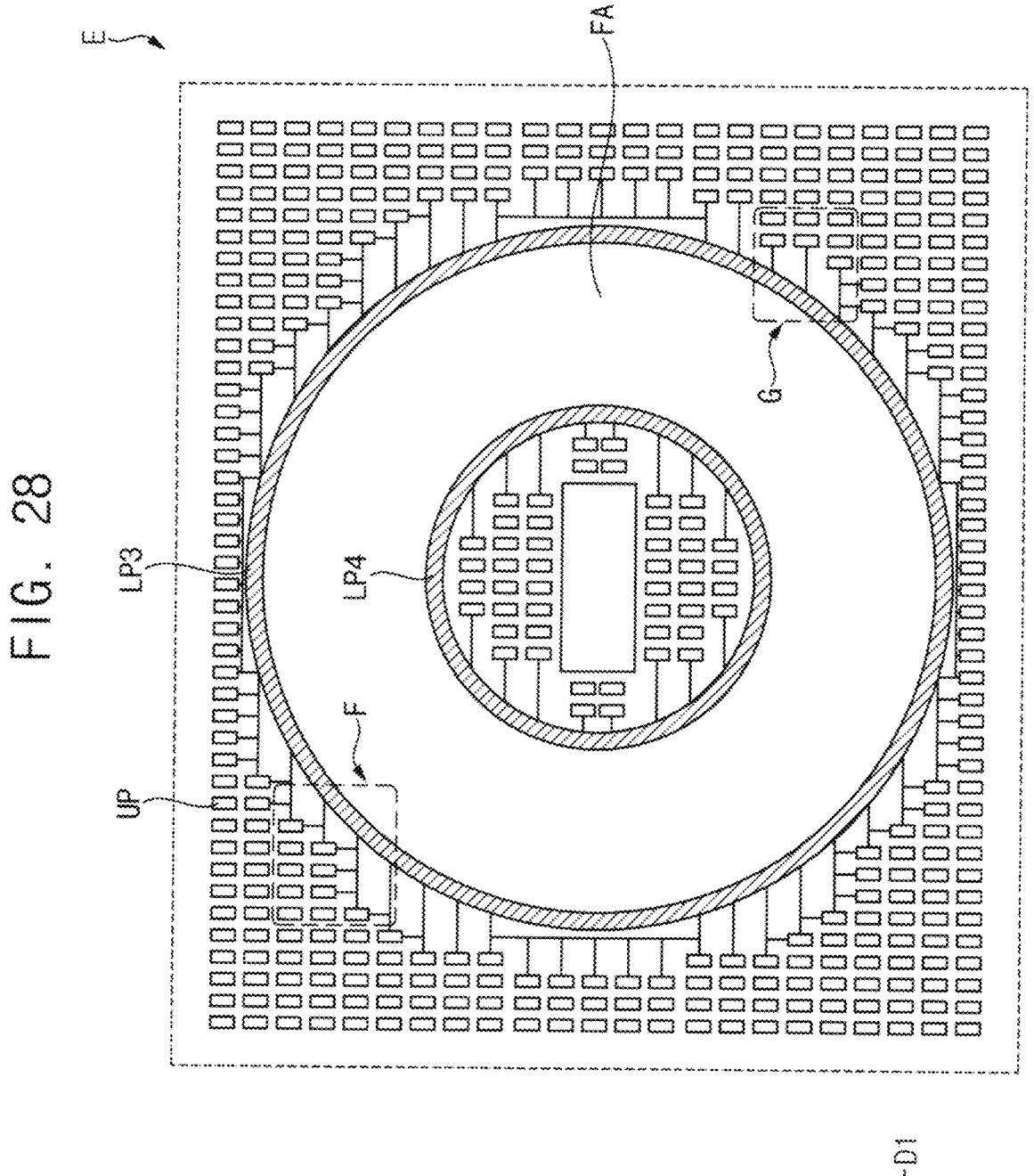
FIG. 28 is an enlarged view illustrating an embodiment of area E of FIG. 19.
Figure 29:
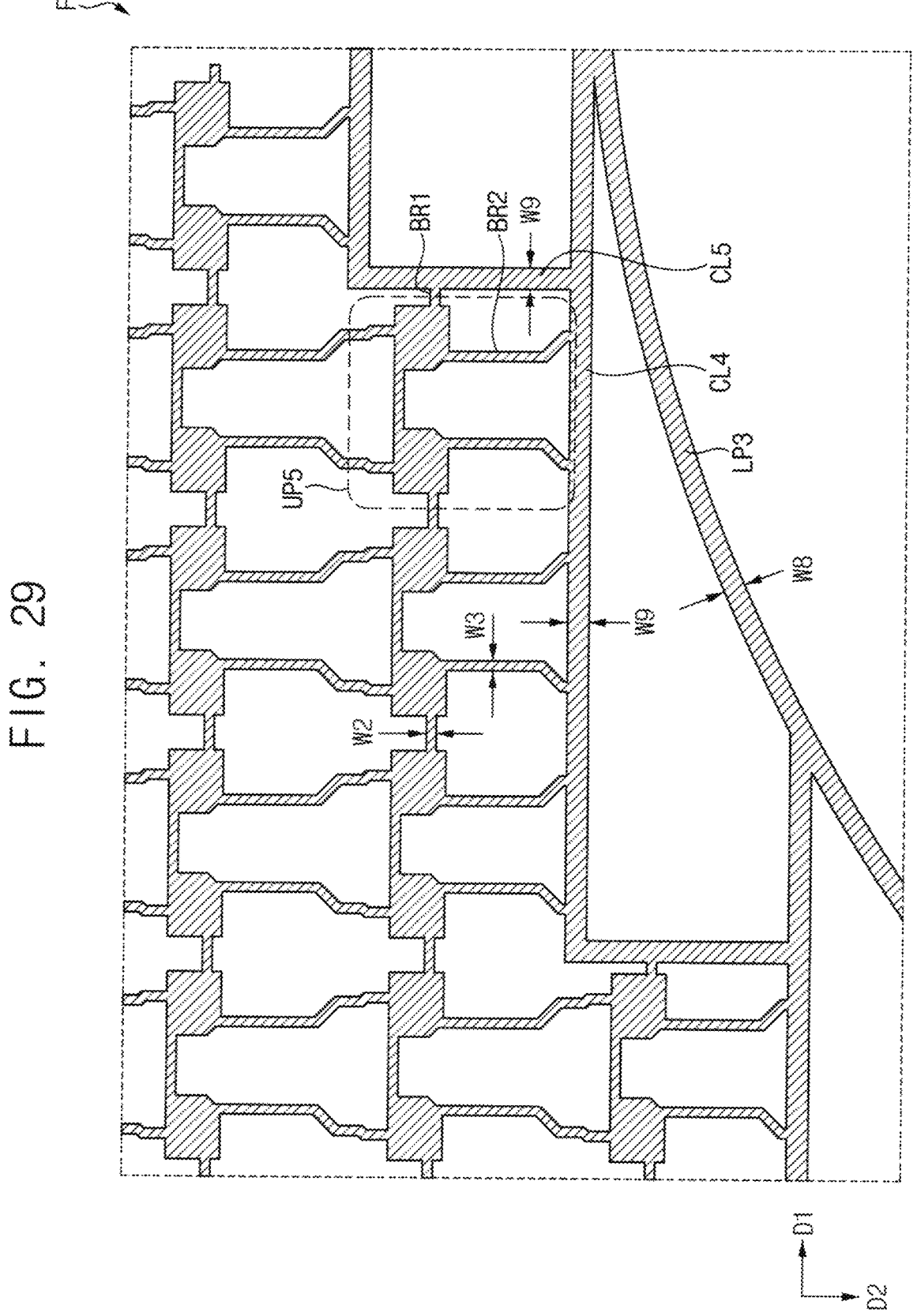
FIG. 29 is an enlarged view illustrating an embodiment of area F of FIG. 28.
Figure 30:
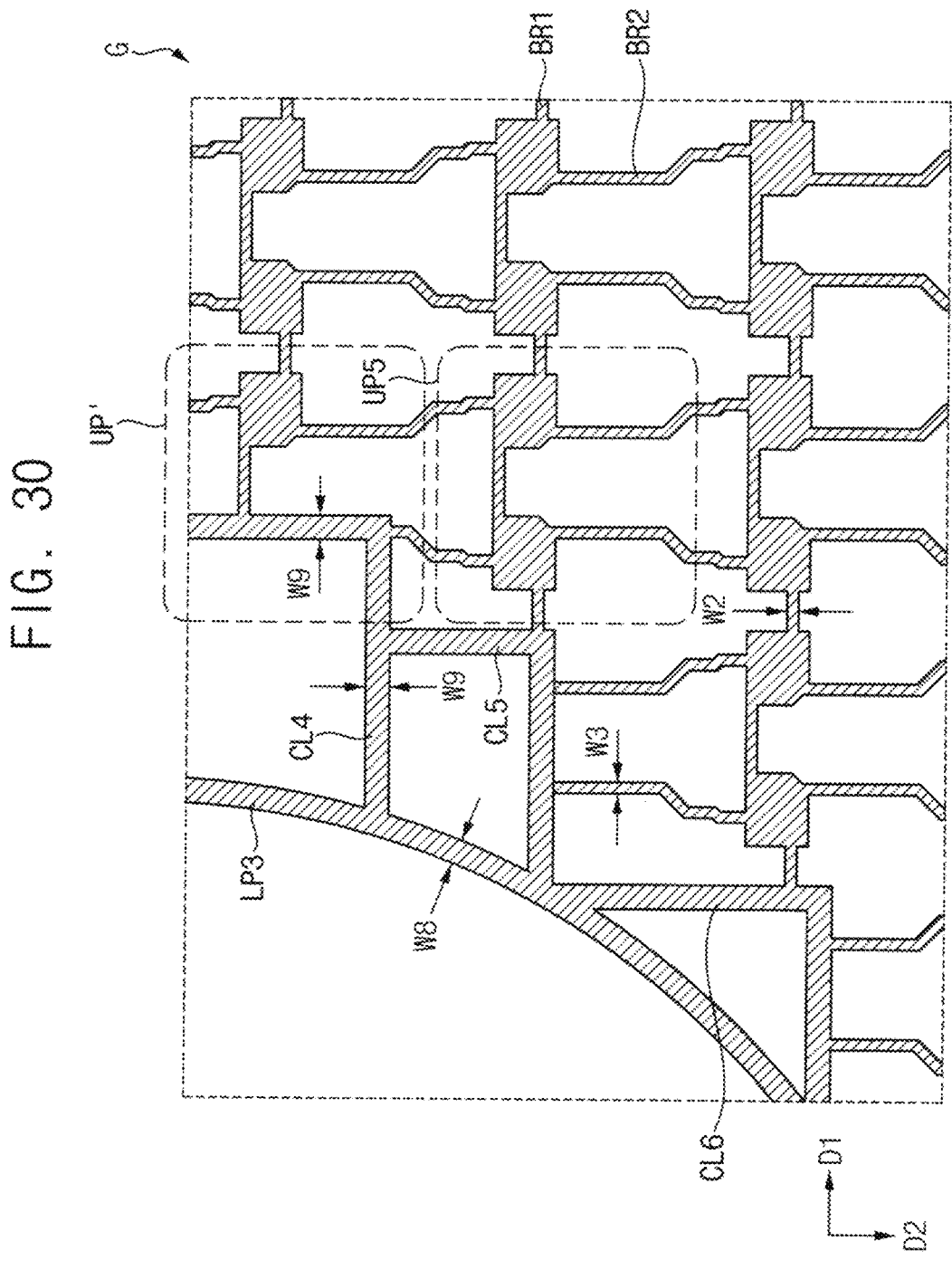
FIG. 30 is an enlarged view illustrating an embodiment of area G of FIG. 28.

FIG. 28 is an enlarged view illustrating an embodiment of area E of FIG. 19. FIG. 29 is an enlarged view illustrating an embodiment of area F of FIG. 28. FIG. 30 is an enlarged view illustrating an embodiment of area G of FIG. 28.

Referring to FIGS. 19, 28, 29, and 30, the third lower pattern LP3 may be connected to the fifth unit patterns UP5, which is adjacent to the hole area FA, among the unit patterns UP.

In an embodiment, as shown in FIG. 29, the display device 10 may further include a fourth connection line CL4 and a fifth connection line CL5, for example. The fourth connection line CL4 may extend in the first direction D1, and may connect the third lower pattern LP3 and the second bridges BR2 included in the fifth unit patterns UP5. The fifth connection line CL5 may extend in the second direction D2, and may connect the fourth connection line CL4 and the first bridges BR1 included in the fifth unit patterns UP5.

In an embodiment, the third lower pattern LP3 may have an eighth width W8. In an embodiment, the eighth width W8 may be smaller than about 4 μm, for example. In addition, each of the fourth connection line CL4 and the fifth connection line CL5 may have a ninth width W9. In an embodiment, the ninth width W9 may be smaller than about 4 μm, for example. In an embodiment, the eighth width W8 and the ninth width W9 may be about 1.8 times greater than the second width W2, for example. In another embodiment, the fourth connection line CL4 and the fifth connection line CL5 may have different widths from each other.

In addition, as shown in FIG. 30, the display device 10 may further include a sixth connection line CL6. The sixth connection line CL6 may extend in the second direction D2, and may connect the third lower pattern LP3 and the first bridges BR1 included in the fifth unit patterns UP5.

In an embodiment, a width of the sixth connection line CL6 may be greater than the second width W2. In addition, the width of the sixth connection line CL6 may be substantially the same as or different from the ninth width W9 of the fifth connection line CL5.

In an embodiment, the sixth connection line CL6 may be selectively provided as needed. In an embodiment, the sixth connection line CL6 may be selectively provided according to an angle defined by a partial shape of the third lower pattern LP3 with the first direction D1, for example. In an embodiment, as shown in FIG. 29, when a partial shape of the third lower pattern LP3 is relatively parallel to the first direction D1 (i.e., an area which has a small angle), the sixth connection line CL6 may not be arranged, for example. As shown in FIG. 30, when a partial shape of the third lower pattern LP3 is relatively perpendicular to the first direction D1 (i.e., an area which has a large angle), the sixth connection line CL6 may be arranged.

The fourth to sixth connection lines CL4, CL5, and CL6 are not limited thereto. The fourth to sixth connection lines CL4, CL5, and CL6 may mean arbitrary lines connecting the third lower pattern LP3 and the fifth unit patterns UP5. In addition, when necessary, a partial unit pattern adjacent to the third lower pattern LP3 may be removed (e.g., a partial unit pattern UP' in FIG. 30).

Referring back to FIG. 28, in an embodiment, the display device 10 may further include a fourth lower pattern LP4 disposed inside the hole area FA. In an embodiment, the unit patterns UP may be further provided inside the hole area FA, and the display device 10 may include the fourth lower pattern LP4 connected to the unit patterns UP provided inside the hole area FA, for example.

The display device 10 in an embodiment of the invention may include the lower pattern layer LPL disposed between the second organic film layer PI2 and the first active pattern 1100. The first lower pattern LP1, the second lower pattern LP2, and the third lower pattern LP3 may be disposed on the lower pattern layer LPL.

The first lower pattern LP1 may be entirely disposed in the display area DA and may have the mesh shape. The first lower pattern LP1 may include the overlap patterns OP overlapping the gate electrodes (e.g., the first gate electrode 1221 and the second gate electrode 1222). The overlap patterns OP may shield the first active pattern 1100 from polarization of organic materials included in the second organic film layer PI2. Accordingly, the electrical characteristics of the first transistor T1 may not be changed.

In addition, as the first lower pattern LP1 includes the first bridges BR1 and the second bridges BR2 which connect the overlap patterns OP to each other, a surface area of the first lower pattern LP1 may be increased, and the overlap patterns OP may be connected to each other. Accordingly, the power voltage ELVDD may be provided to the first lower pattern LP1, and a resistance deviation of the first lower pattern LP1 may be reduced. Therefore, luminance deviation that may occur between the pixels may be prevented.

The second lower pattern LP2 may surround the first lower pattern LP1. In detail, the second lower pattern LP2 may be unitary with the first lower pattern LP1, and may prevent the first bridges BR1 and the second bridges BR2 from protruding. When the first bridges BR1 and the second bridges BR2 protrude, the first bridges BR1 and the second bridges BR2 may serve as lightning rods. As a result, static electricity may flow into the first and second bridges BR1 and BR2 in the process of forming the first lower pattern LP1. The static electricity may flow into the display panel 100 and may cause electric breakdown. However, since the second lower pattern LP2 prevents the first and second bridges BR1 and BR2 from protruding, the static electricity may not flow into the display panel 100 and the electric breakdown may be prevented.

The third lower pattern LP3 may surround the hole area FA. In detail, the third lower pattern LP3 may be unitary with the first lower pattern LP1, and may prevent the first and second bridges BR1 and BR2 adjacent to the hole area FA from protruding.

Although certain embodiments and implementations have been described herein, other embodiments and modifications will be apparent from this description. Accordingly, the invention is not limited to such embodiments, but rather various obvious modifications and equivalent arrangements would be apparent to a person of ordinary skill in the art.

What is claimed is:

1. A display device comprising:
a substrate;
a first barrier layer disposed on the substrate;
a first lower pattern which is disposed on the first barrier layer, includes overlap patterns, a plurality of first bridges, and a plurality of second bridges, and has a mesh shape such that the plurality of first bridges extends in a first direction and connects the overlap patterns to each other, and the plurality of second bridges extends in a second direction crossing the first direction and connects the overlap patterns to each other; and
a second lower pattern which is disposed in a same layer as the first lower pattern, is connected to the first lower pattern, and surrounds the first lower pattern;
wherein
the second lower pattern comprises a horizontal pattern extending in the first direction or a vertical pattern extending in the second direction, the second lower pattern further comprises a corner pattern connecting at least one of the horizontal pattern and the vertical pattern,
the horizontal pattern is connected to second bridges, which are disposed at a top of the mesh shape, among the plurality of second bridges,
the horizontal pattern is provided with a power voltage,
the display device further comprises a power voltage pattern disposed on the horizontal pattern and electrically connected to the horizontal pattern through a contact hole,
the first lower pattern is provided with the power voltage through the power voltage pattern and the horizontal pattern,
the display device further comprises a first connection line and a second connection line,
the first connection line electrically connects the corner pattern and second bridges adjacent to the corner pattern among the plurality of second bridges, and
the second connection line electrically connects the corner pattern and the first connection line.

2. The display device of claim 1, wherein the vertical pattern is connected to first bridges, which are disposed at an edge of the mesh shape, among the plurality of first bridges.

3. The display device of claim 2, wherein the vertical pattern has a first width constant in the first direction.

4. The display device of claim 3, wherein the first width is greater than a second width which is a width of each of the first bridges in the second direction.

5. The display device of claim 4, wherein the first width is about 1.8 times or more greater than the second width.

6. The display device of claim 4, wherein the first width is smaller than about 4 micrometers.

7. The display device of claim 1, further comprising:
a third connection line electrically connecting the first connection line, the second connection line, and the corner pattern.

8. The display device of claim 1, wherein the display device is divided into a hole area in which a hole is defined and a display area surrounding at least a portion of the hole area, and
wherein the display device further comprises a third lower pattern which is disposed in a same layer as the first lower pattern, connects the first lower pattern, overlaps the display area, and surrounds the hole area.

9. The display device of claim 8, further comprising:
a fourth connection line extending in the first direction, and electrically connecting the third lower pattern and second bridges adjacent to the third lower pattern among the plurality of second bridges; and
a fifth connection line extending in the second direction, and electrically connecting the fourth connection line and first bridges adjacent to the third lower pattern among the plurality of first bridges.

10. The display device of claim 9, further comprising:
a sixth connection line extending in the second direction, and electrically connecting the third lower pattern and first bridges adjacent to the third lower pattern among the plurality of first bridges.

11. The display device of claim 1, further comprising:
a second barrier layer disposed on the first lower pattern;
a first active pattern disposed on the second barrier layer; and
a plurality of gate electrodes disposed on the first active pattern and overlapping the overlap patterns.

12. The display device of claim 11, further comprising:

a first gate line which is disposed in a same layer as the plurality of gate electrodes, is adjacent to a first side of the plurality of gate electrodes, and extends in the first direction;

a second gate line which is disposed on the first gate line, is adjacent to a second side of the plurality of gate electrodes opposite to the first side, and extends in the first direction;

a second active pattern disposed on the second gate line;

a third gate line which is disposed on the second active pattern, overlaps the second gate line, is electrically connected to the second gate line, and extends in the first direction; and a power voltage line which is disposed on the third gate line, extends in the second direction, overlaps the plurality of second bridges, and transmits a power voltage.

13. The display device of claim 11, wherein the first lower pattern and the second lower pattern include a same metal as a metal of the plurality of gate electrodes.

14. The display device of claim 1, wherein the first active pattern includes a silicon semiconductor, and wherein the second active pattern includes an oxide semiconductor.

\* \* \* \* \*